United States Patent [19]
Jaeger et al.

[11] Patent Number: 5,841,428
[45] Date of Patent: *Nov. 24, 1998

[54] ROTARY CIRCUIT CONTROL DEVICES WITH CHANGEABLE GRAPHICS

[75] Inventors: Denny Jaeger; Kenneth M. Twain, both of Oakland, Calif.

[73] Assignee: Intertactile Technologies Corporation, Oakland, Calif.

[*] Notice: The term of this patent shall not extend beyond the expiration date of Pat. No. 5,774,115.

[21] Appl. No.: 725,201

[22] Filed: Sep. 20, 1996

Related U.S. Application Data

[63] Continuation-in-part of Ser. No. 644,888, May 10, 1996, abandoned, which is a continuation-in-part of Ser. No. 420,438, Apr. 10, 1995, Pat. No. 5,572,239, which is a continuation of Ser. No. 225,782, Apr. 11, 1994, abandoned, which is a continuation-in-part of Ser. No. 174,545, Nov. 15, 1993, abandoned.

[51] Int. Cl.$^6$ ........................................... G09G 5/00
[52] U.S. Cl. ............................................ 345/184; 345/156
[58] Field of Search ..................... 345/168, 169, 345/170, 171, 172, 173, 184, 905, 156; 341/22, 23, 28, 33, 34

[56] References Cited

U.S. PATENT DOCUMENTS

| | | | |
|---|---|---|---|
| 4,887,968 | 12/1989 | Wickstead et al. | 345/184 |
| 5,156,049 | 10/1992 | Douglas | 345/184 |
| 5,224,649 | 7/1993 | Brown et al. | |

FOREIGN PATENT DOCUMENTS

| | | | |
|---|---|---|---|
| 358195241 | 11/1983 | Japan | 345/172 |
| 9512877 | 5/1995 | WIPO . | |

Primary Examiner—Regina Liang
Attorney, Agent, or Firm—Harris Zimmeran

[57] ABSTRACT

An electrical circuit control of the type having a knob which is turned by an operator to vary a circuit condition is affixed to the face of an electronic image display device and at least a portion of the knob overlays the image display area. This enables display of instantly changeable calibration marks and/or other graphics in close proximity to the circuit control including at locations immediately adjacent to the perimeter of the knob. Electronic components of the control are contained within the knob and a base member at the front of the panel. Components of this kind may be embedded in or attached to the knob itself enabling easy repair by simply replacing the knob and/or may be contained in an easily replaced carrier that fits within the base. Knob motion sensors include radio frequency sensors, capacitive sensors, Hall effect sensors and photoelectric sensors among others and enable the controls to be compact, durable and enable economic manufacture. A signal processor can convert initial values of the control signal produced at successive settings of a control to differing assigned values. The conversion method is applicable to sliding knob controls as well as rotary controls and enables imparting of any desired response curve to a circuit control without regard to the actual response of the knob motion sensor.

48 Claims, 35 Drawing Sheets

FIG. 1
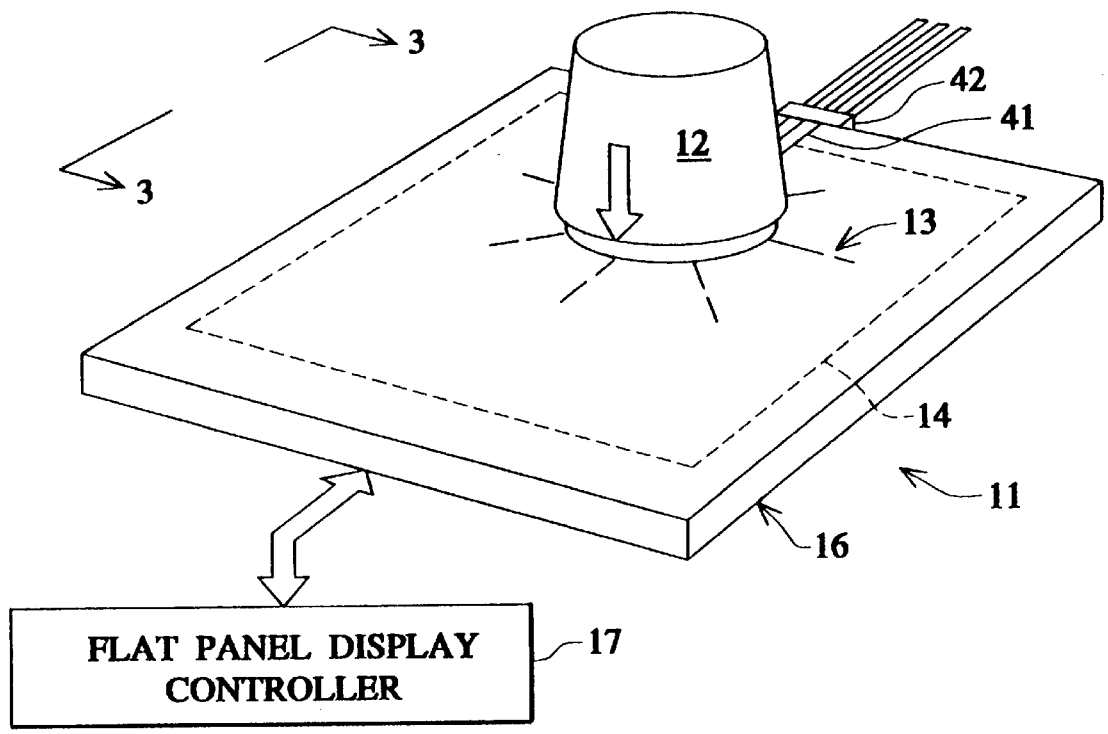
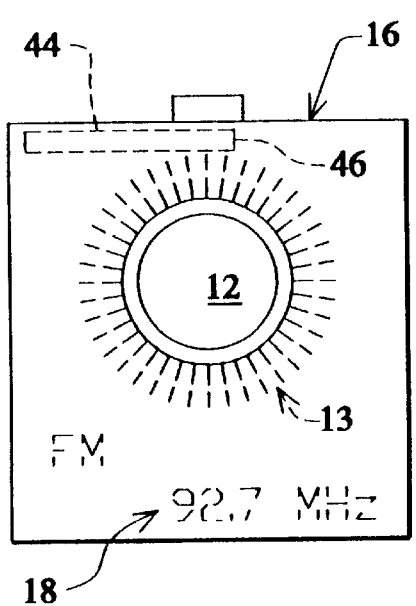
FIG. 2A
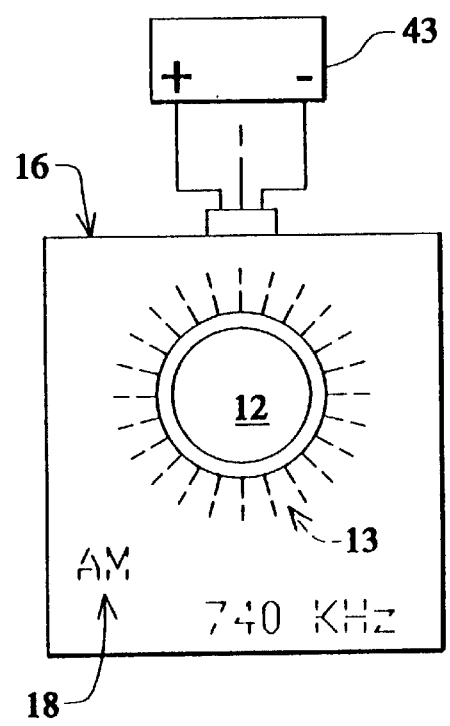
FIG. 2B

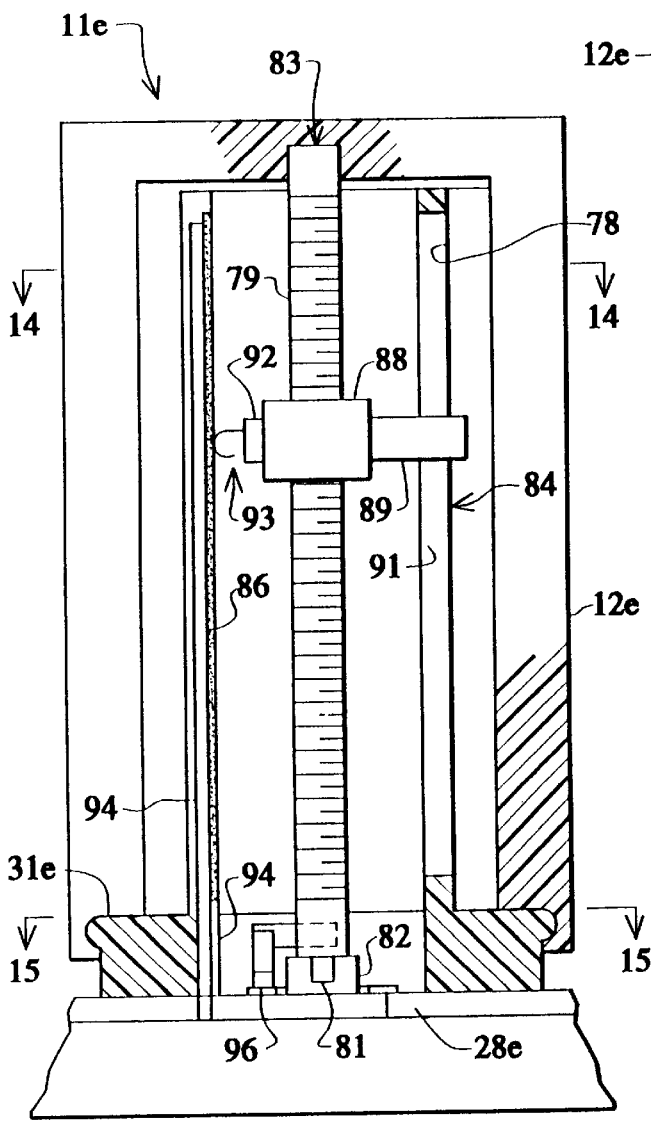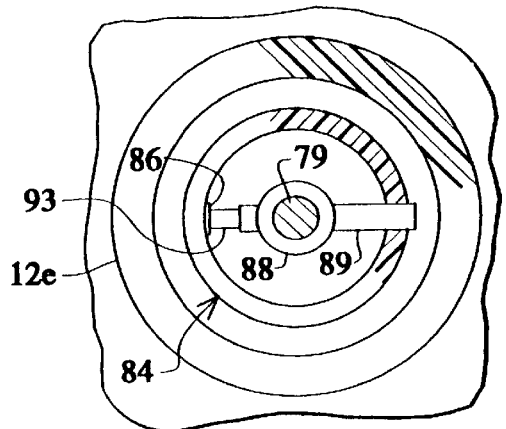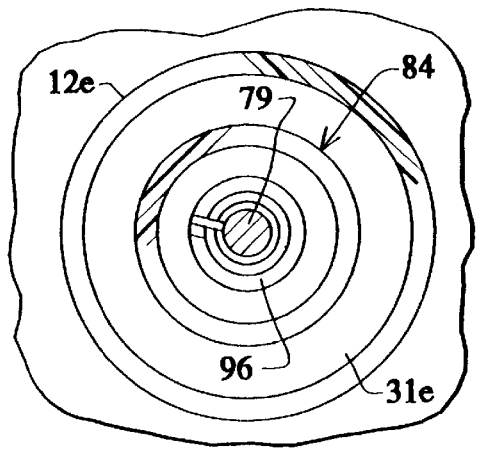
FIG. 13
FIG. 14
FIG. 15

ROTARY CIRCUIT CONTROL DEVICES WITH CHANGEABLE GRAPHICS

CROSS REFERENCE TO RELATED APPLICATIONS

This application is a continuation-in-part of U.S. application Ser. No: 08/644,888 filed on May 10, 1996, now abandoned and which is a continuation-in-part of application Ser. No: 08/420,438 filed on Apr. 10, 1995 now U.S. Pat. No. 5,572,239. Copending application Ser. No: 08/420,438 is a continuation of application Ser. No: 08/225,782 filed Apr. 11, 1994 and which is now abandoned. Application Ser. No: 08/225,782 was a continuation-in-part of application Ser. No: 08/147,545 filed Nov. 5, 1993 and which is now abandoned.

TECHNICAL FIELD

This invention relates to devices which enable operator control of electrical circuits. More particularly the invention relates to circuit control devices of the type having a knob which is turned by an operator about an axis of rotation to vary an electrical signal and wherein a flat panel display produces changeable images that convey information pertinent to operation of the circuit control device.

BACKGROUND OF THE INVENTION

Traditional circuit control devices have a component, such as a turnable knob for example, that is physically moved by the operator in order to change an electrical condition in the controlled circuit. Potentiometers, rotary variable resistors and rotary encoders are examples of control devices of this type. Controls which require physical movement of a component by the operator are preferred by many persons and are less prone to erroneous input because of the tactile feedback which the operator receives. Some newer forms of circuit control such as touch screens for example do not provide this kind of feedback.

Conventional controls which have a knob that is turned by the operator are not well adapted for use with some newer types of electronic circuit. The control typically requires calibration marks or other graphics around the perimeter of the knob and additional graphics which identify the function of the control and/or other information pertaining to operation of the control. In the conventional construction a shaft extends through a control panel. The turnable knob is in front of the control panel. Other components of the control device are behind the panel and are interconnected with the knob by the shaft. The graphics are permanently imprinted on the front of the control panel. Fixed graphics of this kind can severely limit the functions of the control device and can cause operator error under certain circumstances. This problem occurs in electronic systems in which a single control device is used for different purposes at different times. For example, a station selector knob of a radio requires one set of graphics when the radio is operating in the AM mode and a different set of graphics when the radio operates in the FM mode. Multiple function controls of this kind are also found in diverse other types of electronic apparatus such as computer alphanumeric keyboards and synthesizer keyboards for example. In many cases the operator must memorize the alternate functions of such controls or consult a chart or resort to such expedients as disposing an overlay on the controls that is imprinted with changed graphics.

Problems of the above described kind can be alleviated by associating an image display screen with the circuit control device to enable display of instantly changeable images on or in the vicinity of the control. Under microprocessor control, graphics for the control device can be caused to change automatically when the function of the control device changes. Under some circumstances this can be beneficial at single function control devices as well as at multiple function controls. For example, the language of the labeling at a circuit control device can be caused to change instantly in response to operation of a language selection key.

Prior rotary knob circuit control devices having an image display which provides instantly changeable graphics have characteristics that can be a source of problems at least under some circumstances. The control device and the image display screen are at different locations on the control panel and the image display area of the screen is bounded by a pheripheral region of the display which contains structural framing, seals and other components. The display cannot provide calibration marks around the perimeter of the knob and the sizable spacing between the graphics and the knob complicate the operator's task of associating graphics with the specific controls to which they relate.

Some prior rotary controls of the above described kind have a thicker and bulkier construction then is desirable for some usages such as in constricted locations or where a thin control panel is to be disposed against a wall for for example. Some can be difficult and costly to manufacture particularly if precise control signals and a long operating life are desirable criteria. Others can produce only a very limited variety of different graphics.

Repair or replacement of prior rotary knob control devices requires access to the back of the control panel. This complicates such operations and deters many users of control devices from personally undertaking the repair or replacement.

The present invention is directed to overcoming one or more of the problems discussed above.

SUMMARY OF THE INVENTION

In one aspect the present invention provides a control device for an electrical circuit which control device has a base and a turnable knob coupled thereto, the knob being turnable to any of a plurality of different angular orientations to change an electrical condition in the circuit. The base is affixed to an image display device which provides changeable images and is at a location which is in front of the display device and which at least partially overlays the image display area of the display device.

In another aspect of the invention a control device for providing operator selected control signals to a controlled electrical circuit includes an image display device having a screen with a transparent cover plate and an image area thereat at which information pertaining to operation of the control device is displayed. A base member is affixed to the cover plate at a location which is within the image display area. A knob engages on the base member and is turnable about an axis of rotation that extends at right angles to the cover plate. A control signal producing circuit produces a control signal indicative of the angular orientation of the knob about the axis of rotation, the control signal producing circuit being contained within the knob and base member.

In another aspect the invention provides a method for processing control signals produced by an electrical circuit control device of the type in which manual movement of a first component along a series of different settings causes a second component to produce a circuit control signal that progressively changes during the course of the movement to identify the successive settings of the first component. Steps in the method include detecting and storing the original value of the control signal at each of a series of different settings of the first component. An assigned value for the control signal at each of the series of different settings of the first component is designated which assigned values may differ from the original values. Each assigned value is stored in association with the corresponding original value. Thereafter, movement of the first component is responded to by converting detected original values of the control signal to the associated assigned values.

The operator manipulated turnable knob of embodiments of the invention is engaged on a base member which is affixed to the face of an image display device such as a flat panel display or a cathode ray tube for example. The knob is at a location which is at least partially within the image display area. This enables display of calibration marks and/or other graphics in close proximity to the perimeter of the turnable knobs of the circuit control devices. Consequently, the operator can more easily associate the graphics with the particular knob to which they relate and precise setting of the control is facilitated. The displayed graphics may change instantly and automatically when the function of the control device changes or when other conditions call for changed graphics. The invention further provides for detection of operator adjustment of a turnable knob by any of a variety of different and advantageous motion sensing means. In one form of the invention a data processing circuit alters the control signals which it receives in order to compensate for non-linearities at successive settings of the control device or to compensate for departures of the signal from a desired non-linear response to operator adjustment of the control. Electrical components of the control device which produce the control signal are contained within the knob and/or the base member at the front of the panel which supports the control device making them easily accessible for maintenance or replacement. In one form of the invention components of this kind are contained within a knob which may have a low cost construction and can be easily replaced as a unit by simply replacing the knob itself.

The invention, together with further aspects and advantages thereof, may be further understood by reference to the following description of the preferred embodiments and by reference to the accompanying drawings.

BRIEF DESCRIPTION OF THE DRAWINGS

FIG. 1 is a perspective view of a first embodiment of the invention showing an electrical circuit control device which in this example is potentiometer of the type having a knob which the operator turns to vary a control signal voltage.

FIG. 2A is a front view of the first embodiment of the invention depicting graphics which are displayed during a first mode of operation of the control device.

FIG. 2B is another front view of the first embodiment of the invention showing changed graphics which are displayed during a second mode of operation.

FIG. 13 is an axial section view of the rotary knob region of another embodiment of the circuit control device which is a potentiometer that produces a continuously increasing or decreasing output voltage as the knob is turned through more than one full revolution.

FIG. 14 is a cross section view taken along line 14—14 of FIG. 13.

FIG. 15 is a cross section view taken along line 15—15 of FIG. 13.

DETAILED DESCRIPTION OF THE PREFERRED EMBODIMENTS

Figure 3:
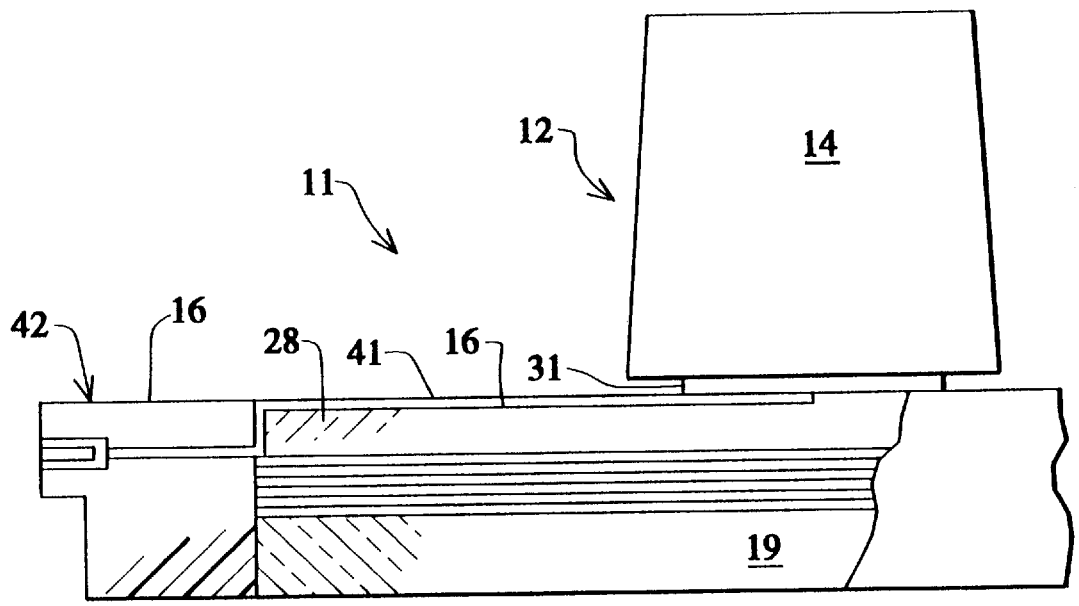
FIG. 3 is a broken out side view of a portion of the first embodiment of the invention taken along line 3—3 of FIG. 1.

The invention is applicable to electrical circuit control devices of the type which have a knob that is manually turned to vary a circuit control signal or to turn a circuit on and off. As an initial example, FIG. 1 depicts a potentiometer 11 type of circuit control device which has a rotary knob 12 that is grasped and turned by the operator to selectively vary an output voltage. Potentiometers typically have indicia 13 at angular intervals around the perimeter of the knob 12 which identify specific angular settings of the control device.

Embodiments of the present invention differ from prior control devices that serve similar purposes in that the component which the operator manipulates, knob 12 in this example, is situated at least partially within the image display area 14 of an electronic image display device 16 of one of the kinds that produces instantly changeable images. In this example of the invention the display device 16 is a flat panel display. At least some of the indicia 13 and/or other graphics pertinent to operation of the control device 11 are images generated by the flat panel display 16. A flat panel display controller 17 which may be of known design is coupled to to the flat panel display 16 to cause display of the indicia 13 and/or other appropriate graphics.

Situating the knob 12 or other operator manipulated component in front of the image display area 14 in this manner enables display of the indicia 13 at locations which are immediately adjacent to the knob 12 or the like. This avoids operator error with respect to associating the graphics with the particular control device to which they relate and enables precision setting of the control device. The arrangement can also enhance the appearance of control panels. Referring to FIGS. 2A and 2B, graphics 18 may flash on and off, change form and purely decorative graphics may be displayed in the vicinity of the knob 12. The display controller 17 can change the graphics 13, 18 instantly when the function of the knob 12 is changed.

For purposes of example, FIGS. 2A and 2B depict changing graphics 13, 18 which are appropriate when the potentiometer 11 is the station selector of a radio which selectively operates in either an AM or FM mode. The potententiometer 11 can be used to control diverse other types of known circuits of the kind that respond to control signals in the form of a variable voltage or to digitized control signals which are originated in the form of a variable voltage.

Figure 4:
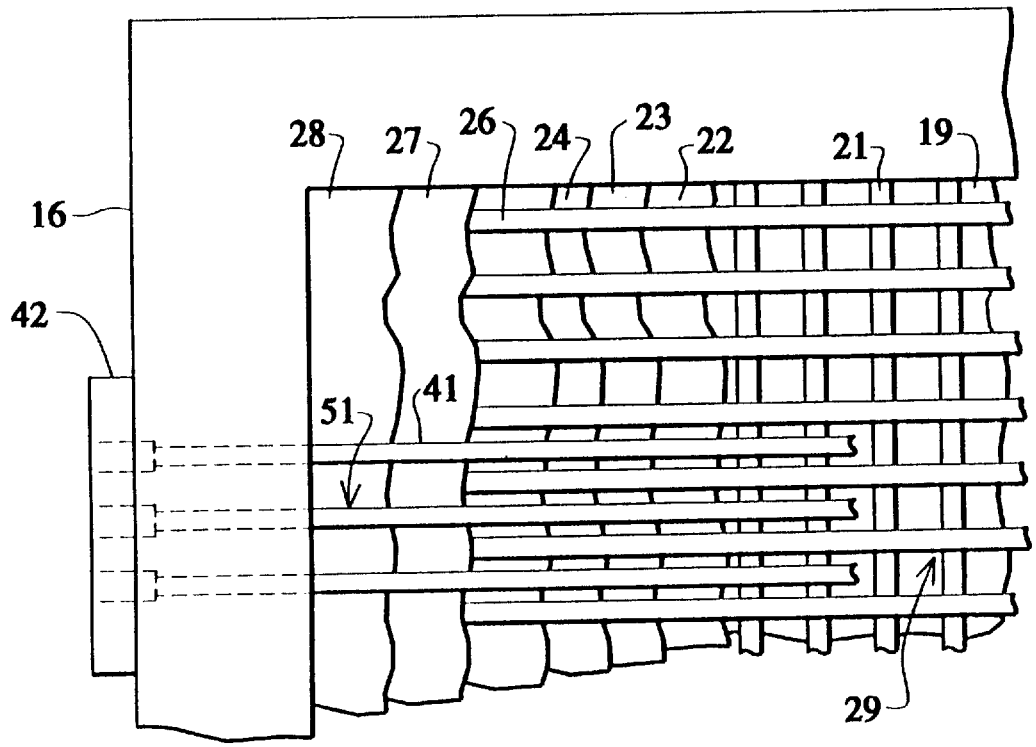
FIG. 4 is a broken out frontal view of a portion of the first embodiment showing the multi-layered construction of a flat panel display which is a component of the control device.

Referring jointly to FIGS. 3 and 4, the flat panel display 16 may be of any of the known types and may be of known design except as hereinafter described. For purposes of example, FIGS. 3 and 4 depict a flat panel display 16 of the TFEL (thin film electro-luminescent) type. Flat panel displays 16 of this kind are multi-layered and have a flat substrate 19 which may be rigid or flexible and which may variously be formed of glass, ceramic or plastic. The substrate 19 is overlaid, in sequence, by a layer of row busbars 21, a first dielectric layer 22, a phosphor layer 23, a second dielectric layer 24, a layer of column busbars 26, a sealing and passivation layer 27 and a transparent cover plate 28 which may be glass or clear plastic. Row busbars 21 are parallel conductive traces bonded to substrate 19 and extend in an x-coordinate direction. Column busbars 26 are parallel conductive traces deposited on the second dielectric layer 24 and extend in a y-coordinate direction. The points at which the row and column busbars 21 and 26 cross each other define an array of image pixels 29 at which the phosphor layer 23 emits light when a voltage difference is applied across the row and column busbars that cross each other at a particular pixel location. Thus any desired image can be produced by applying a voltage difference across the particular row busbars 21 and column busbars 26 that define image pixels 29 at which light needs to be emitted to form the image.

Figure 5:
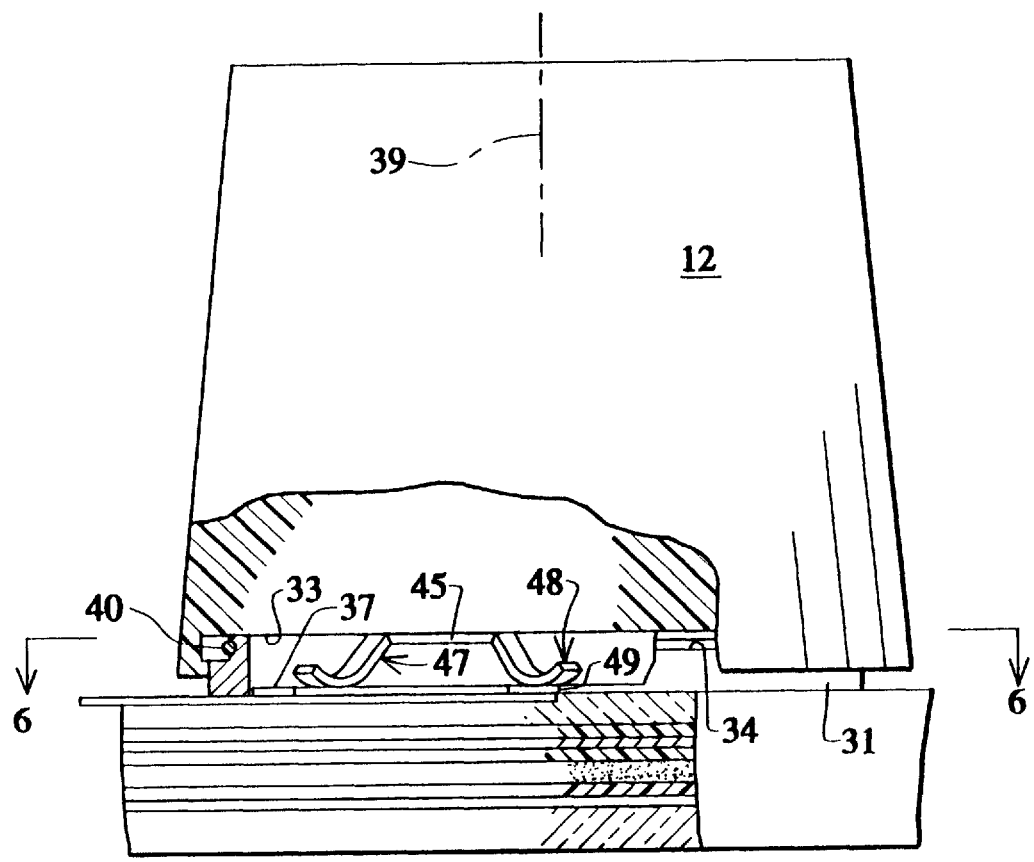
FIG. 5 is a broken out side view of the rotary knob region of the first embodiment showing certain internal components thereof.
Figure 6:
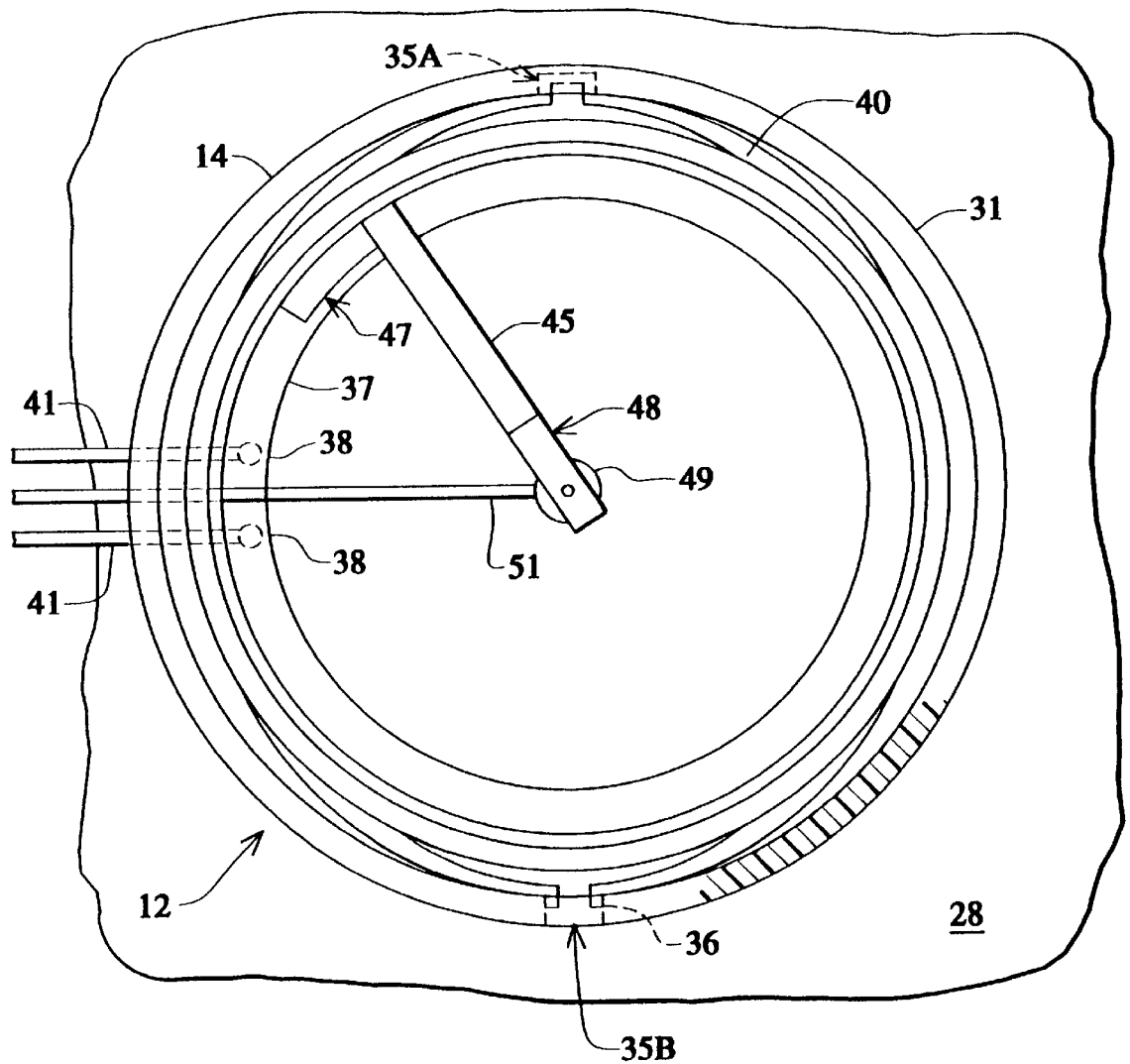
FIG. 6 is a cross section view taken along line 6—6 of FIG. 5.

Knob 12 is engaged on a base member 31 which is bonded to the front surface 32 of transparent cover pate 28. In an alternate construction the base member may be secured to a second transparent cover plate which is overlaid on the original transparent cover plate of the flat panel display. Referring now to FIGS. 5 and 6 in conjunction, the base member 31 of this example is annular and extends into an opening 33 in the base of the knob 12, the opening being of larger diameter than the base member. The base member has a circular groove 34 which extends around the member within opening 33. A resilient clasp 40 formed of spring steel or the like has a generally elliptical configuration and has a first end 35A that is secured to the wall of opening 33. A flattened opposite end 35B of the clasp 40 extends into a slot 36 in the portion of knob 12 that encircles opening 33. The end of base member 31 is beveled and forces a temporary expansion of the clasp 40 as the knob 12 is being forced onto the base member after which the clasp seats in groove 34 and retains the knob on the base member. The knob 12 can be easily removed from the base member 31 by forcing end 35B of clasp 40 inward at slot 36 with the tip of a screwdriver or similar tool. This expands the clasp 40 and forces it out of groove 34. The clasp 40 and groove 34 may be replaced with other structure for engaging the knob on the base member examples of which will be hereinafter described.

A trace 37 of electrically resistive material is bonded to the front surface 32 of transparent cover plate 28 within the base member 31 and is of circular configuration except that the resistor trace is discontinuous at at one location and thus has spaced apart ends 38, the once being centered on the axis of rotation 39 of knob 12. A pair of spaced apart electrically conductive traces 41 extend along front surface 32 of cover plate 28 from ends 38 of the resistor trace 37 to a connector 42, shown in FIG. 1, at an edge of the flat panel display 16. Connector 42 provides for connection of the conductive traces 41 to a voltage source 43 shown in FIG. 2B.

Referring again to FIGS. 5 and 6, the connection of the ends 38 of resistor trace 37 to a voltage source creates a progressive voltage drop along the trace. To provide a selectable output voltage, a resilient and conductive dual wiper contact 45 extends from knob 12 within the knob opening 33. Contact 45 has a first wiper arm 47 positioned to contact resistor 37 and to travel along the trace as the knob is turned. A second wiper arm 48 of contact 45 extends into contact with a conductive pad 49 which is bonded to the front surface 32 of cover plate 28. Another conductive trace 51 extends along the front surface of cover plate 28, in parallel relationship with traces 41 to connect pad 49 with the previously described connector 42 thereby enabling transmission of an operator selected voltage to the circuit which the potentiometer 11 controls.

The conductive traces 41 and 51 which extend along the cover plate 28 within the image display area may be formed of transparent conductive material, such as indium tin oxide, to avoid interference with viewing of the displayed graphics.

Figure 7:
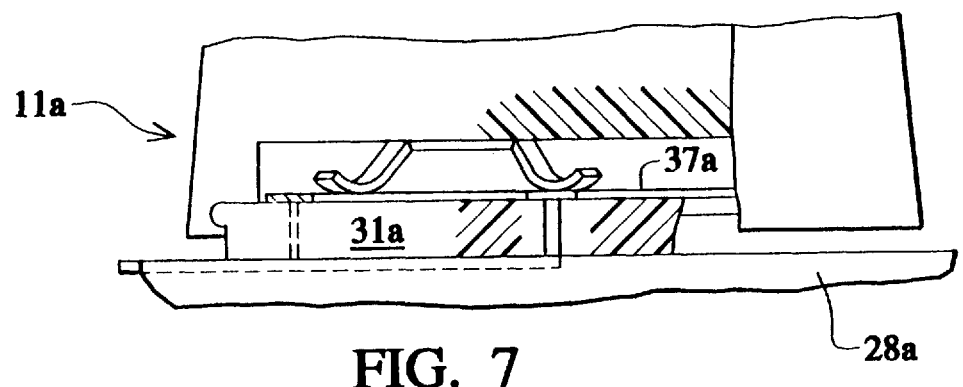
FIG. 7 is a broken out side view of the rotary knob region of a control device which is a first modification of the control device of FIG. 5.

FIG. 7 depicts a modification of the potentiometer 11a in which the base member 31a is a disk of insulative material and in which the resistor trace 37a is bonded to the base member rather than being directly bonded to the cover plate 28a. Potentiometer 11a may otherwise be similar to the previously described embodiment.

Figure 8:
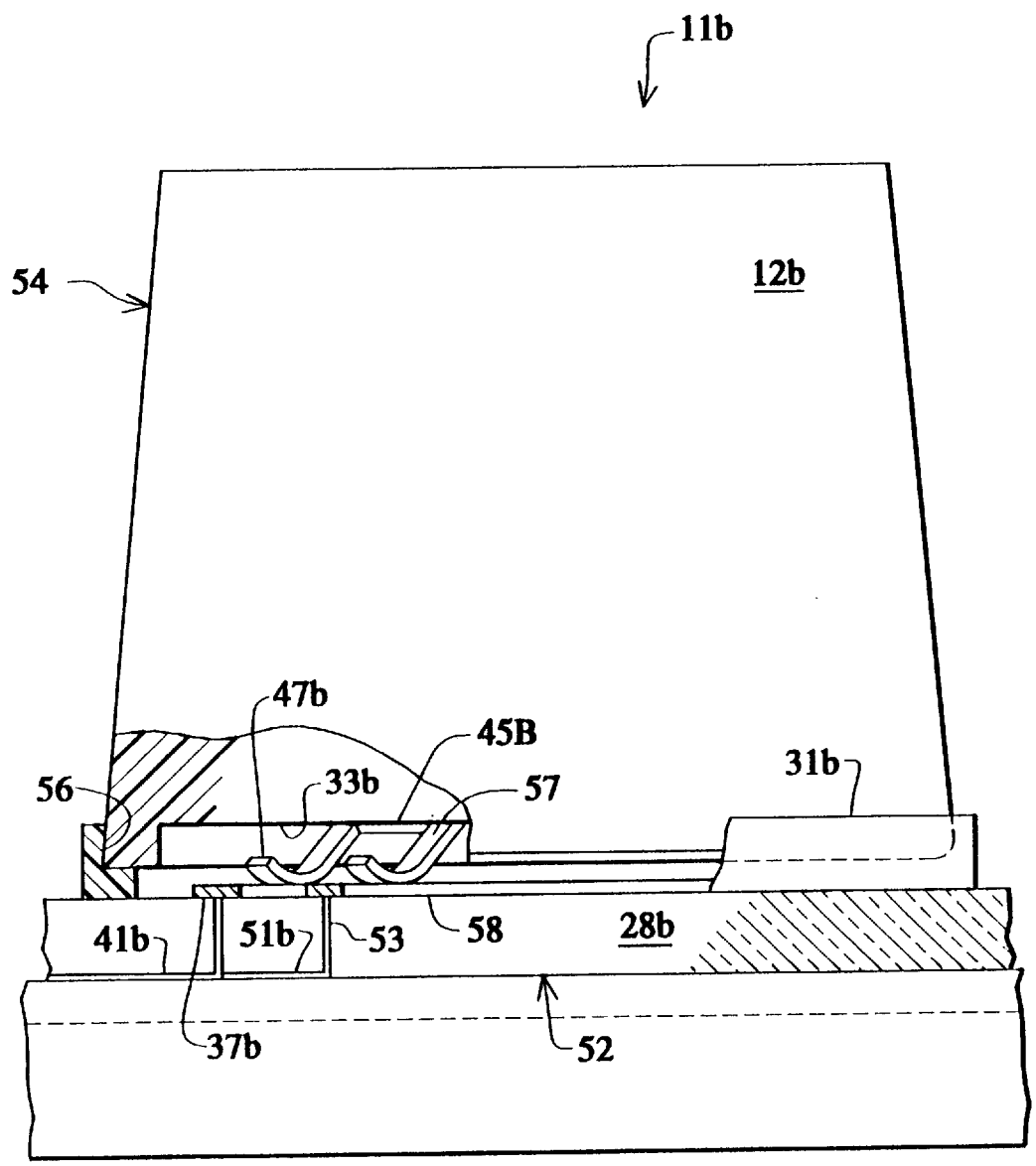
FIG. 8 is another broken out side view of the rotary knob region of a circuit control device which is a second modification of the control device of FIG. 5.

FIG. 8 depicts another modification of the potentiometer 11b in which the conductive traces 41b which connect with the ends of the resistor trace 37b and the trace 51b which connects with wiper contact 45b extend along the back surface 52 of transparent cover plate 28b. This protects the traces 41b, 51b from abrasion. Connector pins 53 extend through the cover plate 28b to connect the traces 41b and 51b in the previously described manner with components that are within the base member 31b.

The knob 12b of this embodiment has a tapered side surface 54 that is broadest at its base. The snap engagement of knob 12b onto base member 31b is made by forcing the base of the knob into a conforming annular recess 56 in the inner surface of the base member. The dual wiper 45b of this embodiment has a first wiper arm 47b that rides on the resistor trace 37b and a second arm 57 which contacts and travels along a circular trace 58 of conductive material which is coaxial with the resistor trace and which is bonded to the cover plate 28b. One of the connector pins 53b extends through cover plate 28b to connect the circular trace 58 with conductive trace 51b.

Referring jointly to FIGS. 4 and 8, disposition of the conductive traces 41b, 51b at the back surface 52 of the transparent cover plate 28b in the above described manner makes it possible to form such traces of non-transparent material, such as copper or aluminum for example, without creating any noticeable disruption in images which are viewed through the cover plate. Referring to FIG. 4 in particular, this may be accomplished by positioning the traces 41b and 51b to extend in parallel relationship with the rows of image pixels 29 at locations which are between two rows of pixels.

Figure 9:
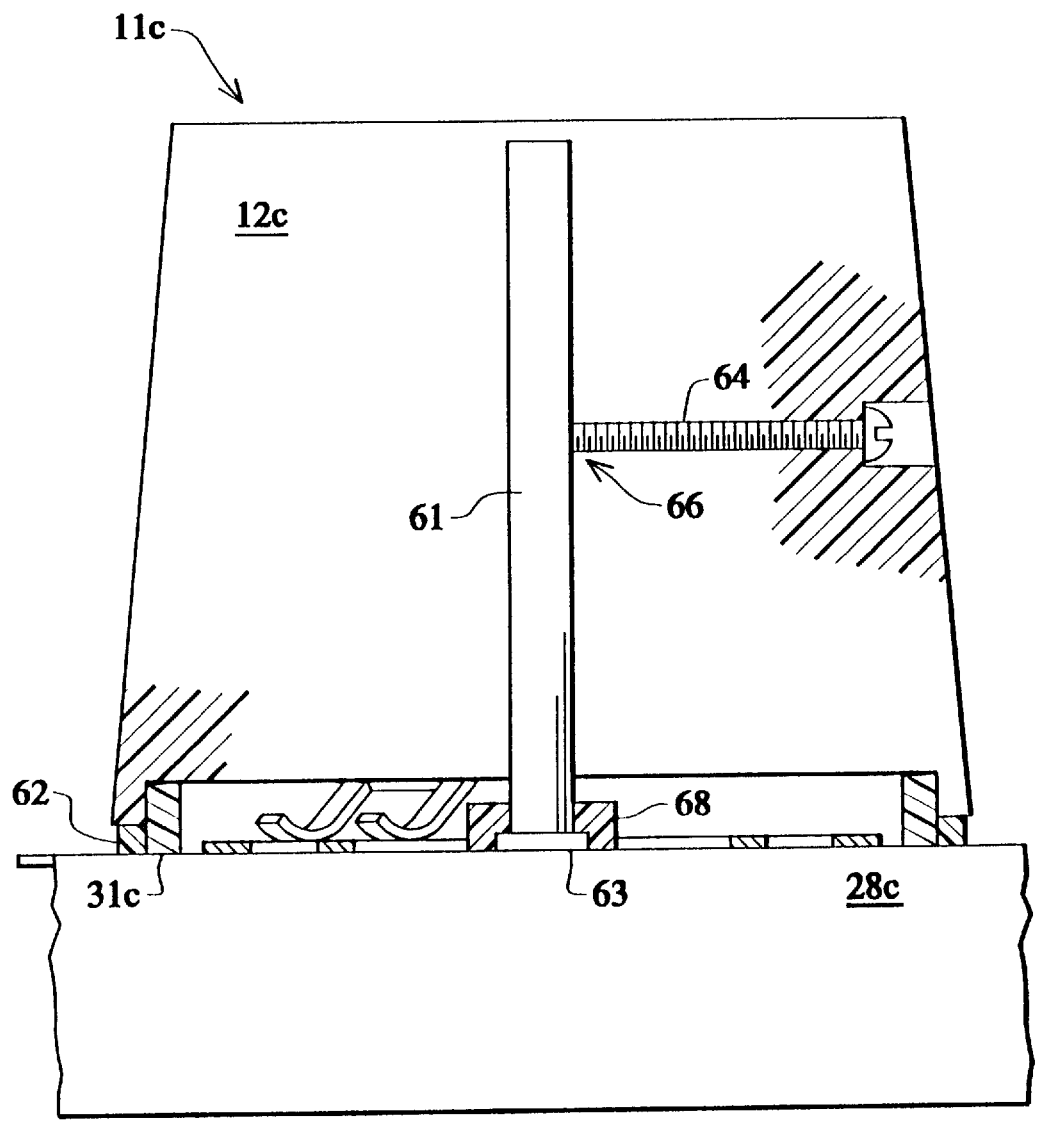
FIG. 9 is still another broken out side view of the rotary knob region of a circuit control device which is a third modification of the control device of FIG. 5.
Figure 12A:
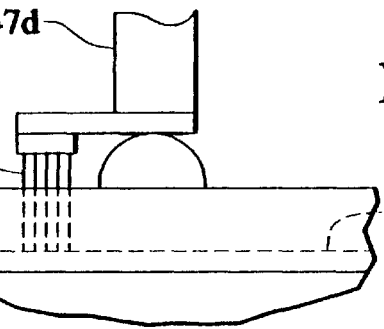
FIG. 12A is an elevation view of the apparatus of FIG. 12 taken along line 12—12 thereof.

In the modification of the potentiometer 11c which is shown in FIG. 9, the turnable knob 12c does not snap engage on the base member 31c as in the previously described embodiments. The knob 12c simply fits onto a circular base member 31c and is held in place by a turnable rod 61 which extends along the axis of rotation of the knob. A flanged end 63 of rod 61 extends out of the base of the knob 12c. A set screw 64 extends radially within the knob and engages rod 61. A housing 68 encircles and overlaps the flanged end 63 of the rod 61 and is bonded to the face of cover plate 28c in order to hold the knob 12c on base member 31c. The rod 61 can turn freely on the base member 31c but is held in position by the housing 68 and flange. An annular stop 62, formed of a material having a low coefficient of friction, such as Teflon for example, extends between the peripheral region of the base of knob 12c and cover plate 28c. The stop 62 prevents breakage of the glass cover plate by flange 63 which might otherwise occur if an operator should exert a strong lateral force on the knob 12c. The potentiometer 11c is otherwise similar to the previously described embodiment of FIG. 8.

Figure 10:
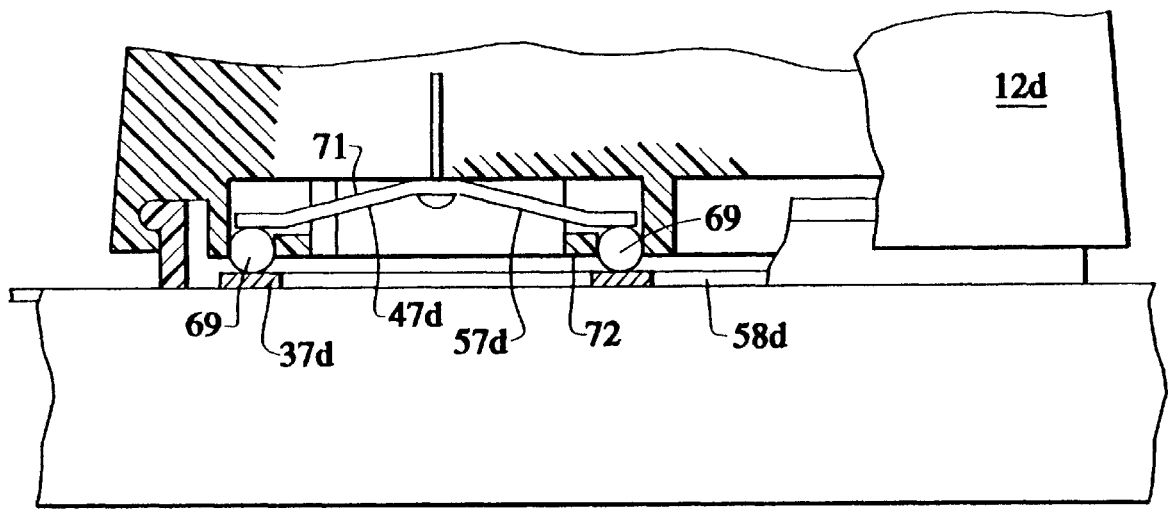
FIG. 10 is another broken out side view of the rotary knob region of a circuit control device which is a fourth modification of the control device of FIG. 5.

The previously described embodiments of the invention each have at least one wiper contact which bears against and travels along a resistor trace. FIG. 10 depicts a form of wiper contact which can prolong the life of the control devices by reducing abrasion of the resistor traces. A small spherical ball 69 formed of electrically conductive material is disposed between each wiper contact 47d or 57d that travels along a resistor trace 37d or conductive trace 58d. Small cylindrical rollers can be substituted for the balls 69. In this example, the wiper contacts 47d and 57d are opposite ends of a conductive leaf spring 71 which bear against the balls 69 and which is secured at its center to the knob 12d. Wiper contacts 47d and 57d extend into housings 72 in the base of knob 12d which hold the balls 69 at the traces 37d and 58d.

Figure 11:
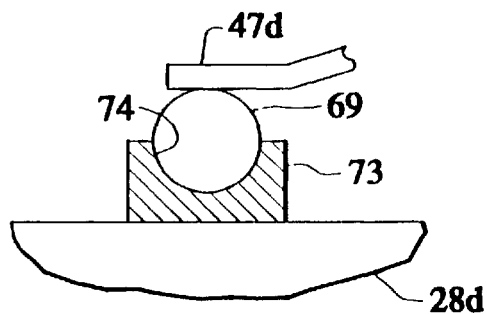
FIG. 11 illustrates a further modification of the apparatus of FIG. 10.
Figure 12:
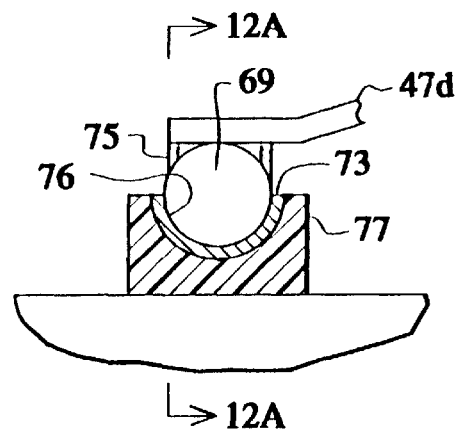
FIG. 12 illustrates another modification of the apparatus of FIG. 10.

The need for housings 72 can be eliminated if, as shown in FIG. 11, the resistive or conductive trace 73 is made sufficiently thick to enable a circular groove 74 to be formed in the trace and the ball 69 is seated in the groove. A similar result is obtained if, as shown in FIG. 12, the trace 73 is a thin lining in a groove 76 formed in a circular base 77 which is bonded to the cover plate 28, the base being formed of insulative material.

Automatic cleaning of the trace 73 can be provided for by a brush 75, formed of mildly abrasive flexible fibers, which extends from the wiper arm 47d to trace 73 and which bears against the exposed surface of the trace as the arm travels along the trace.

The invention is highly advantageous when embodied in a turnable knob type of circuit control device of the kind which does not revert to an initial setting after each full revolution of the knob but instead proceeds to progressively higher settings throughout two or more revolutions of the knob. The invention enables display of progressively higher ranges of output signal values around the perimeter of the knob during successive revolutions of the knob. FIGS. 13, 14 and 15 depict a multi-turn potentiometer of this kind.

Referring jointly to FIGS. 13, 14 and 15, the potentiometer 11e has an annular base member 31e bonded to the front surface of a flat panel display cover plate 28e and a turnable knob 12e which is snap engaged on the base member in the previously described manner. The knob 12e is typically longer than in the previously described embodiments and has a hollow interior 78 that is open at at the base-of the knob. A threaded rod 79 within the knob 12e extends along the axis of rotation of the knob and has a pilot projection 81 at one end that seats in a bearing 82 that is bonded to the front surface of cover plate 28e. The other end 83 of rod 79 extends into the material of the knob 12e at the distal end of the knob and is bonded thereto thereby causing the rod to turn with the knob.

Base member 31e has a cylindrical sleeve portion 84 which extends up into the interior 78 of knob 12e and which encircles rod 79 in spaced apart relationship therewith. A trace or strip of resistive material 86 is bonded to the inside surface of the sleeve portion 84 and extends in parallel relationship with the rod 79. An internally threaded collar 88 encircles rod 79 and engages the threads of the rod. An arm 89 extends radially from collar 88 into a longitudinal slot 91 in sleeve portion 84 of the base member 31e. This prevents rotation of the collar 88 and causes it to travel along rod 79 when the knob 12e is turned, the direction of travel being determined by the direction of the turning of the knob.

Another radially directed arm 92 extends from collar 88 and carries a wiper contact 93 which bears against and travels along the resistive trace 86. Conductors 94 embedded within the sleeve portion 84 of base member 31e extend up from the surface of cover plate 28e to apply differing voltages to the opposite ends of the resistive trace 86. Rod 79 and collar 88 including arm 92 are formed of electrical conductor enabling the output voltage of the potentiometer lie to be picked up by another wiper contact 96 which is bonded to the front surface of cover plate 28e.

Provided that the rod 79 and resistive trace 86 are of sufficient length, the potentiometer lie outputs a continuously increasing or continuously decreasing voltage signal as the knob 12e is revolved through a plurality of full revolutions. Referring again to FIG. 1, the flat panel display controller 17 can be conditioned to change the calibration marks 13 each time a full revolution of the knob is completed in order to conform the marks with the current range of output voltages.

Any of the previously described potentiometers can be used as a variable resistor if voltage is applied to only one end of the resistive trace.

Figure 16:
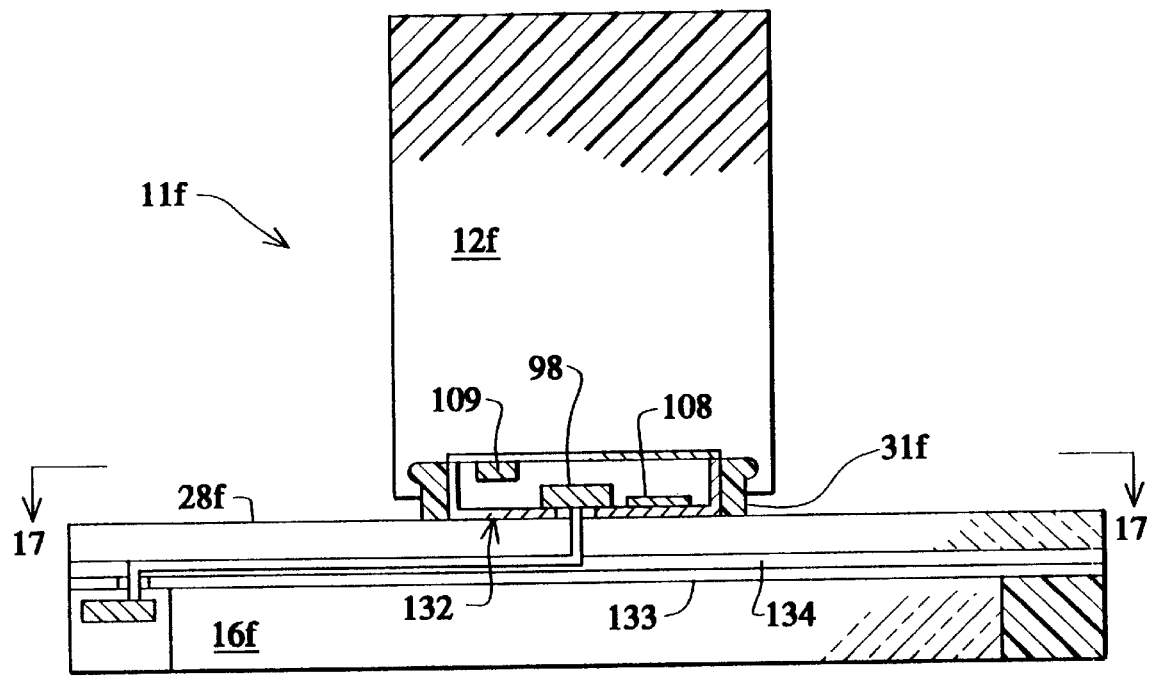
FIG. 16 is a cross section view of rotary knob type of electrical circuit control device which uses a radio frequency circuit to sense and track turning of the knob.

Abrasion over a period of time can adversely affect output signal accuracy in potentiometers which include a moving wiper contact that rubs against a resistor. The function of a potentiometer can be realized without making use of such components. For example, with reference to FIGS. 16 and 17 in conjunction, a radio frequency circuit 97 can be used to sense the setting of a turnable knob 12f and to track angular motion of the knob.

The embodiment of FIGS. 16 and 17 again has a turnable knob 12f snap engaged on an annular base member 31f which is bonded to the transparent cover plate 28f of a flat panel display 16f within the image display area in the manner previously described. A small integrated circuit board or chip 98 is adhered to the surface of cover plate 28f within the base member 31f. Chip 98 includes two electrical oscillators 99 and 101, shown in FIG. 18, which may be of any of the known types such as Colpitts oscillators for example. The chip 98 also includes two buffer amplifiers 102 and 103 and two capacitors 104 and 106 which are the capacitive components of the resonant circuits of the oscillators 99 and 101. Referring again to FIGS. 16 and 17, the inductive component of the resonant circuit of each oscillator is one of a pair of inductance coils 107 and 108 which are within the base member 31f. Coils 107 and 108 are preferably spiral shaped conductive traces bonded to the surface of cover plate 28f.

Coils 107 and 108 are at different locations relative to the axis of rotation of knob 12f and are preferably situated at locations which are 90° apart relative to the axis of rotation. A body 109 of electrically conductive metal, which is preferably ferromagnetic material, is secured to the base of knob 12f at a location which is offset from the axis of rotation of the knob.

Figure 17:
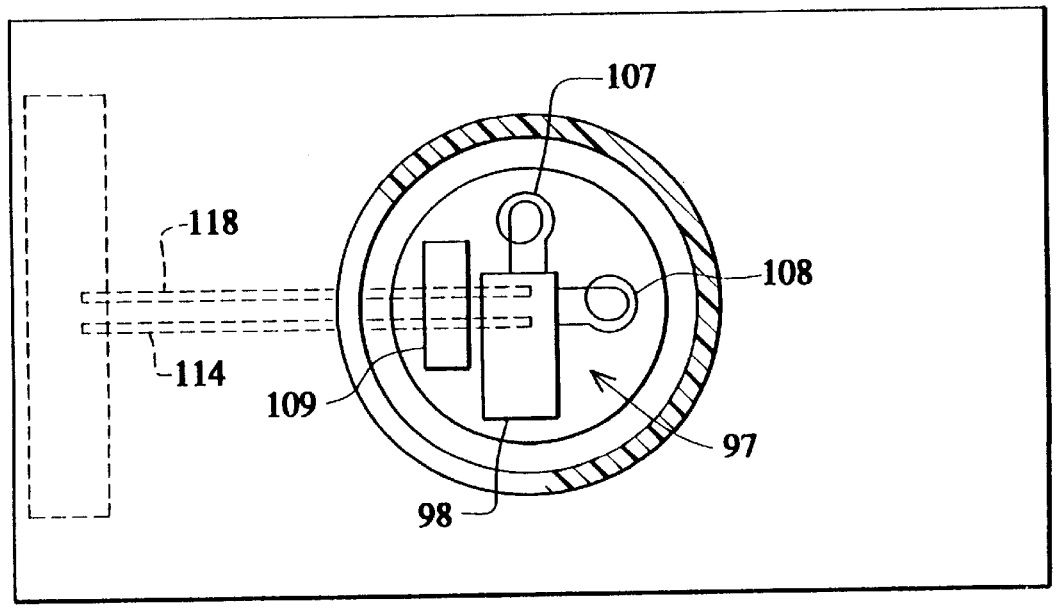
FIG. 17 is a plan section view of the circuit control of FIG. 16 taken along line 17—17 thereof.
Figure 18:
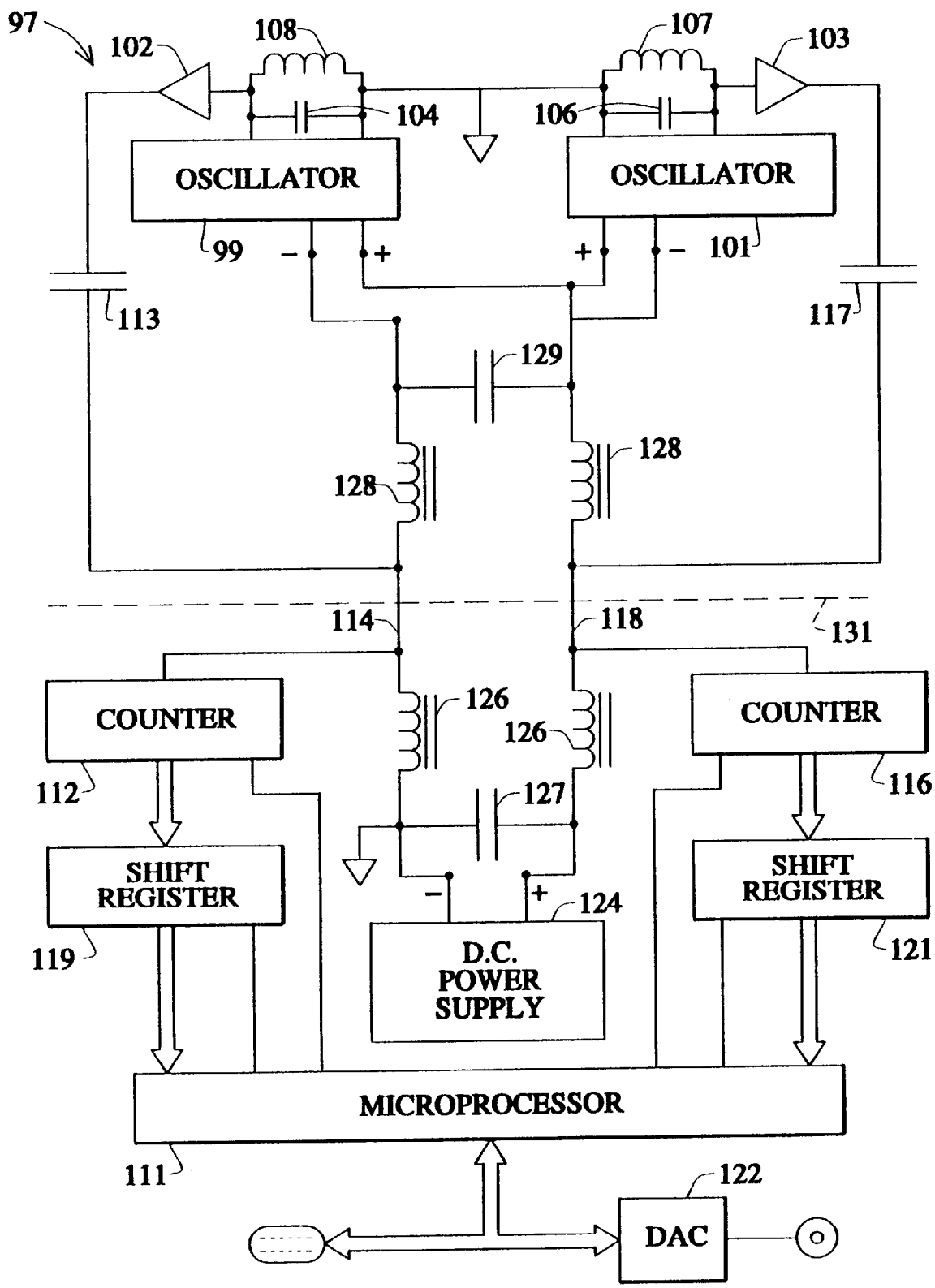
FIG. 18 is a schematic circuit diagram depicting electronic components of the circuit control device of FIGS. 16 and 17.

Referring jointly to FIGS. 17 and 18, the resonant frequencies of both oscillators 99 and 101 are affected by the presence of the conductive body 109 in close proximity to the coils 107 and 108 and the frequency of each of the oscillators changes as the body 109 becomes closer or further away from the coil 107 or 108 of the oscillator. The frequency shifting effect on the two oscillators 99 and 101 is different at any given time as the two coils 107 and 108 are at different locations along the path of revolution of the body 109. Consequently the ratio of the frequencies of the two oscillators 99 and 101 varies as knob 12f is turned and is different at each angular setting of the knob. This allows a microprocessor 111 to identify the rotational position of knob 12f at any given time and to output a control signal which is a function of the angular position of the knob.

Referring to FIG. 18 in particular, the resonant circuit of oscillator 99 is coupled to the input of a counter 112 through buffer amplifier 102, a capacitor 113 and a first conductor 114 which extends between the location of the oscillators and the location of the microprocessor 111. The resonant circuit of the other oscillator 101 is coupled to the input of another counter 116 through the other buffer amplifier 103, another capacitor 117 and a second conductor 118 that extends to the location of the microprocessor 111.

Figure 18A:
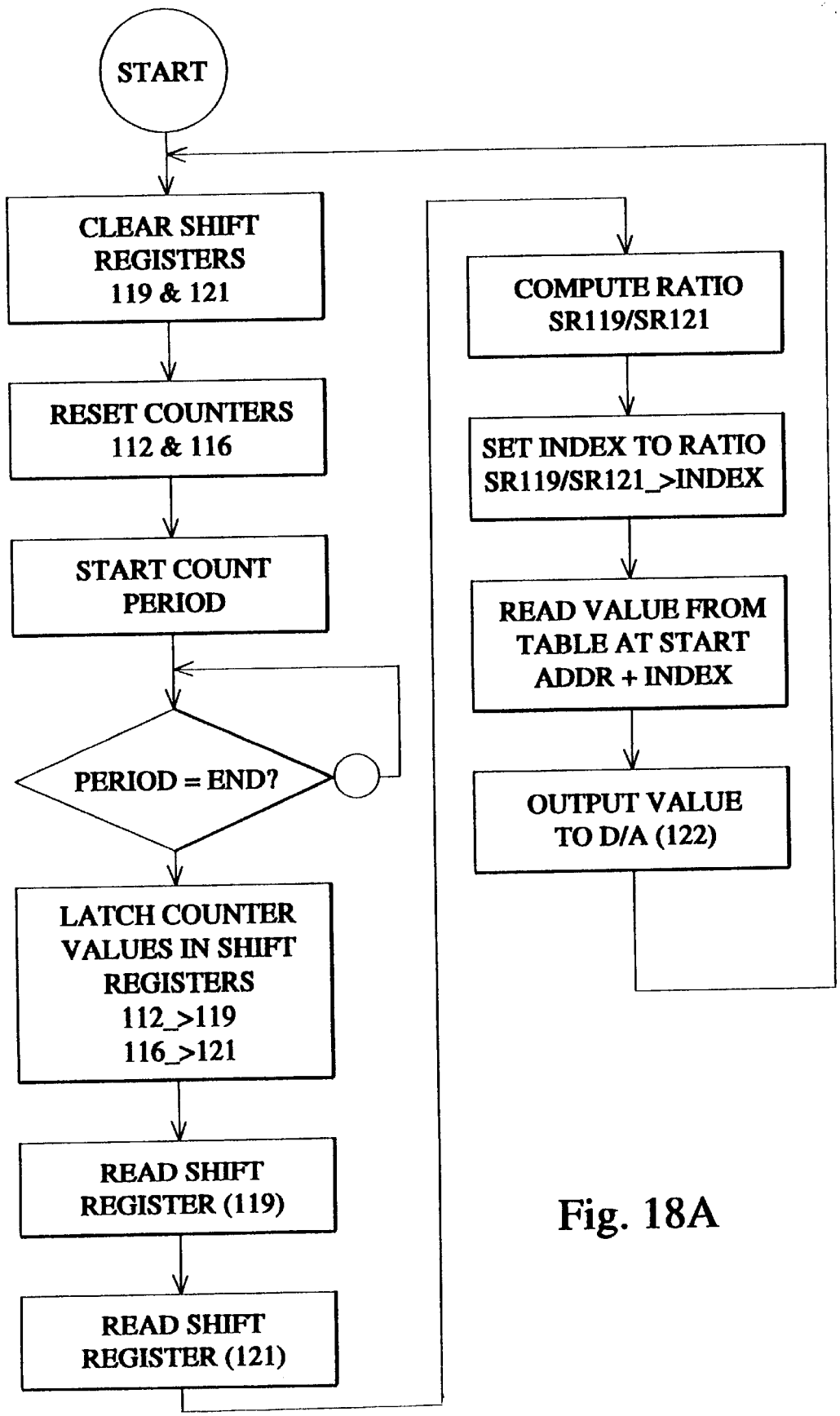
FIG. 18A is a flowchart program depicting operations performed by a digital data processor component of the circuit of FIG. 18

Each counter 112 and 116 counts the number of radio frequency cycles that are generated by the associated oscillator 99 or 101 during successive time periods of fixed duration. The accumulated counts are transferred to shift registers 119 and 121 at the end of each such time period and the counters are reset to a count of zero by the microprocessor 111. FIG. 18A depicts the microprocessor program in flowchart form. Referring jointly to FIGS. 18 and 18A, microprocessor 111 repetitively reads the shift registers 119 and 121, computes the ratio of the frequencies of the two oscillators, and consults a look-up table which is configured within the microprocessor to determine the control signal magnitude that should be outputted at the current angular setting of the turnable knob. The current control signal value is outputted in digital form if the controlled electrical circuit responds to digital control signals or is delivered through a digital to analog converter 122 if the controlled circuit responds to a variable voltage type of control signal.

Capacitors 113 and 117 are present in the above described circuit to enable transmission of the high frequency signals and also DC operating current on the single pair of conductors 114 and 118 that extend between the location of the oscillators 99 and 101 and the location of the microprocessor 111 which may be at the edge region of the flat panel display. The conductors 114 and 118 each connect with a separate one of the terminals of a DC power supply 124 through a separate one of a pair of inductance coils 126. A capacitor 127 is connected across the DC power supply terminals. This forms a filter which allows DC current to be transmitted to conductors 114 and 118 and which isolates the power supply from the high frequency signals. The other ends of conductors 114 and 118 connect with the DC power inputs of both oscillators 99 and 101 through separate ones of another pair of inductance coils 128 and another capacitor 129 is connected between the positive and negative terminals of the oscillators. This keeps the high frequency signals out of the oscillator power terminals. Capacitors 113 and 117 isolate the buffer amplifiers from the DC current.

In FIG. 18 components which are above the dashed line 131 are situated inside the turnable knob and base member assembly of the control device and components which are below the dashed line are in the edge region of the flat panel display.

Referring again to FIGS. 16 and 17, the radio frequency circuit which is within the base member 31f can be adversely influenced by external influences which alter the inductance and/or capacitance of the resonant circuits or create circuit noise. Under some circumstances the operator's fingers can have an effect of this kind. It preferable that the region inside base member 31f be isolated from influences of this kind by a lining 132 Mu metal shielding. The lining 132 substantially encloses the region in which the radio frequency circuit components are situated. The driver circuits within the flat panel display 16f itself can under some circumstances adversely interact with the components on the cover plate 28f. This can be prevented by disposing a thin layer 133 of electrical conductor between the cover plate 28f and the other layers of the flat panel display 16f. Insulation 134 isolates the signal and power conductors 114 and 118 from the conductive layer 133.

Figure 19:
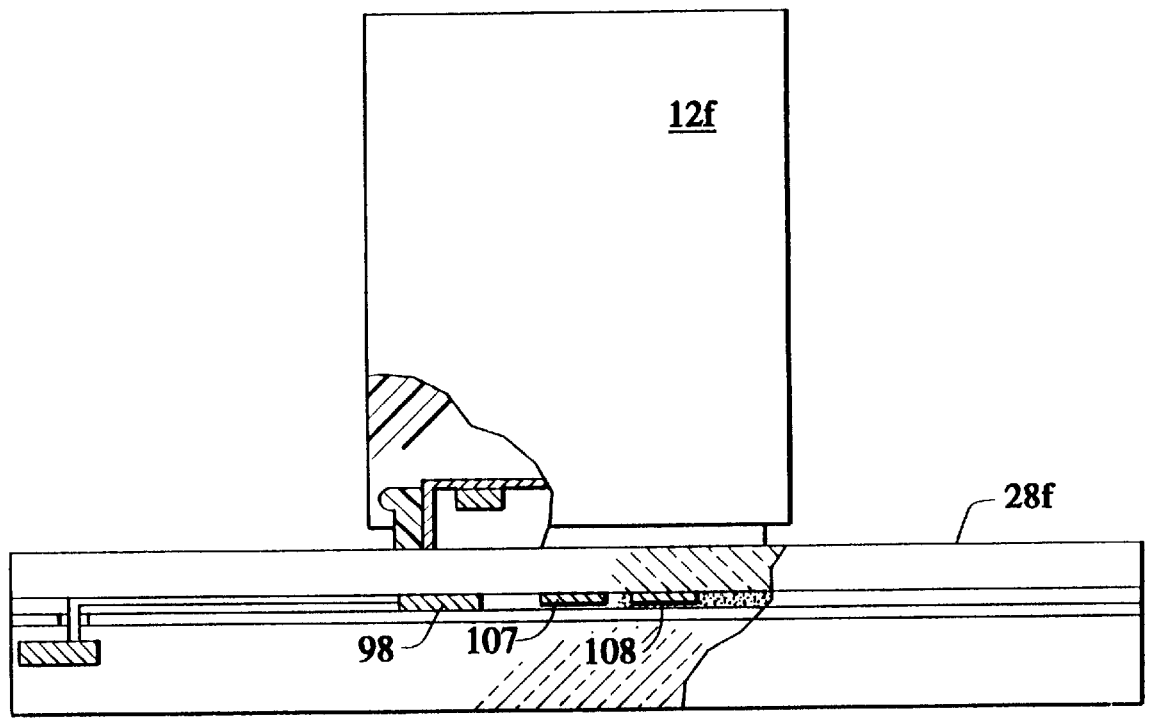
FIG. 19 is a broken out side view of a modification of the circuit control device of FIGS. 16 to 18.
Figure 20:
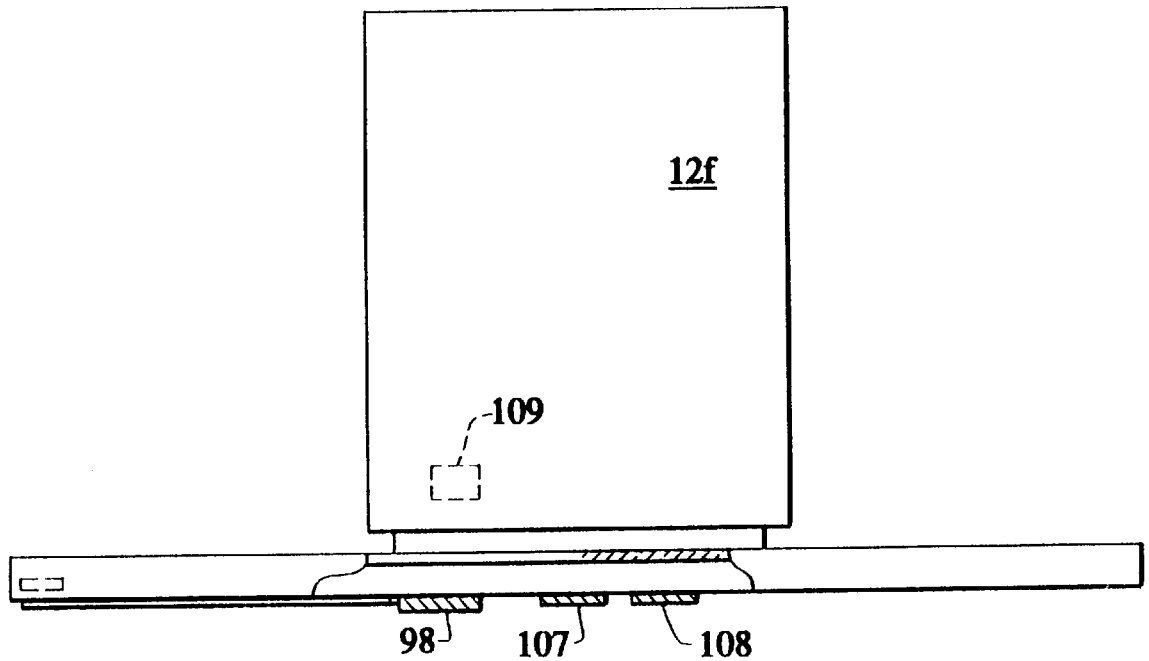
FIG. 20 is a broken out side view showing another modification of the circuit control device of FIGS. 16 to 18.

Referring to FIG. 19, the integrated circuit chip 98 and coils 107 and 108 can alternately be situated at the back surface of the cover plate 28f at a location behind the knob 12f. As shown in FIG. 20, the chip 98 and coils 107 and 108 can also be at the back surface of the flat panel display 16f if the display is sufficiently thin to enable interaction with the body 109 of conductive material within the turnable knob and if there are no solid conductive layers within the display. The control devices of FIGS. 19 and 20 may otherwise be similar to the control device of FIGS. 16 to 18.

Figure 21:
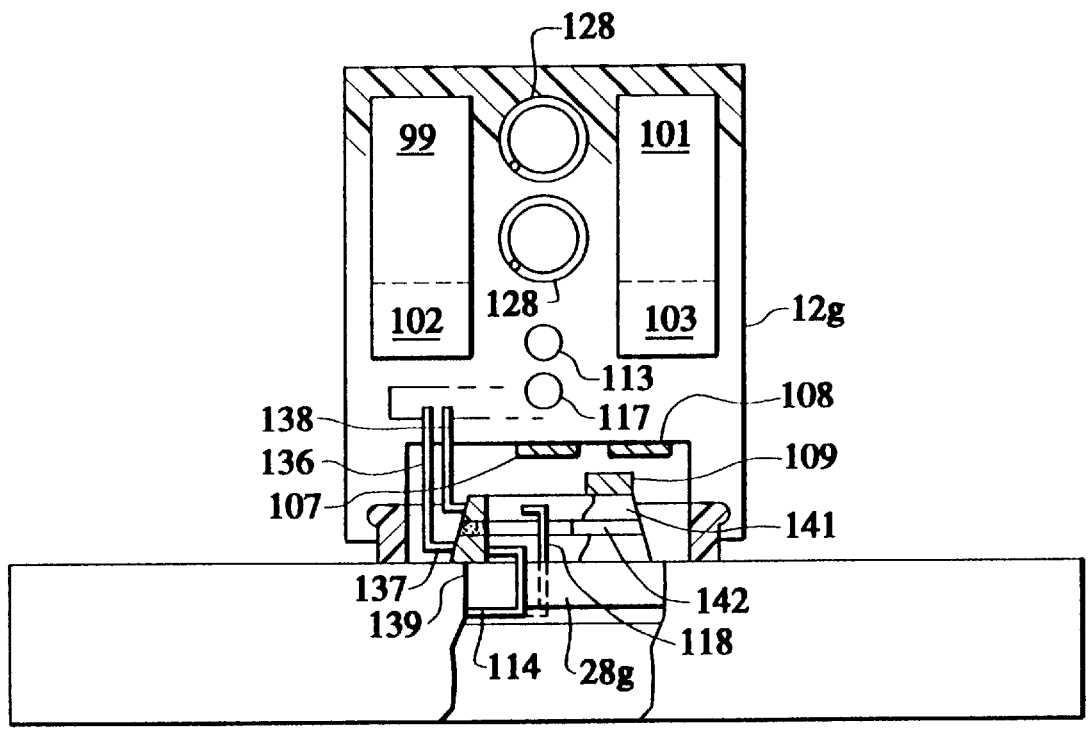
FIG. 21 is a broken out side view of another rotary knob type of circuit control device which also uses a radio frequency circuit to track turning of the knob.

Referring to FIG. 21, circuit components such as the oscillators 99 and 101, buffer amplifiers 102, 103, inductance coils 128 and capacitors 113 and 117 can also be embedded within the turnable knob 12g. The oscillator coils 107 and 108 in this case are bonded to the knob 12g within an opening 136 in the knob that faces toward the transparent cover plate 28g and are positioned, relative to the axis of rotation of the knob, as previously described. The circuit components which are within the knob 12g are connected to the DC power and radio frequency signal conductors 114 and 118 that extend along the cover plate 28g through a pair of wiper contacts 137 and 138 which extend from the knob within opening 136. Contact 137 bears against a first beveled conductive ring 139 that is bonded to the surface of the cover plate 28g and which is centered on the axis of rotation of the knob 12g. Contact 138 bears against a second similar ring 141 which overlays ring 139 and which is electrically isolated therefrom by an annular band 142 of insulation. Power and signal conductor 114 is connected to ring 139 and conductor 118 connects to ring 141. The body 109 of conductive material that varies the frequencies of the oscillators 99 and 101 is secured to the second ring 141 by adhesive or other means at a location which is offset from the axis of rotation of the knob 12g.

Figure 22:
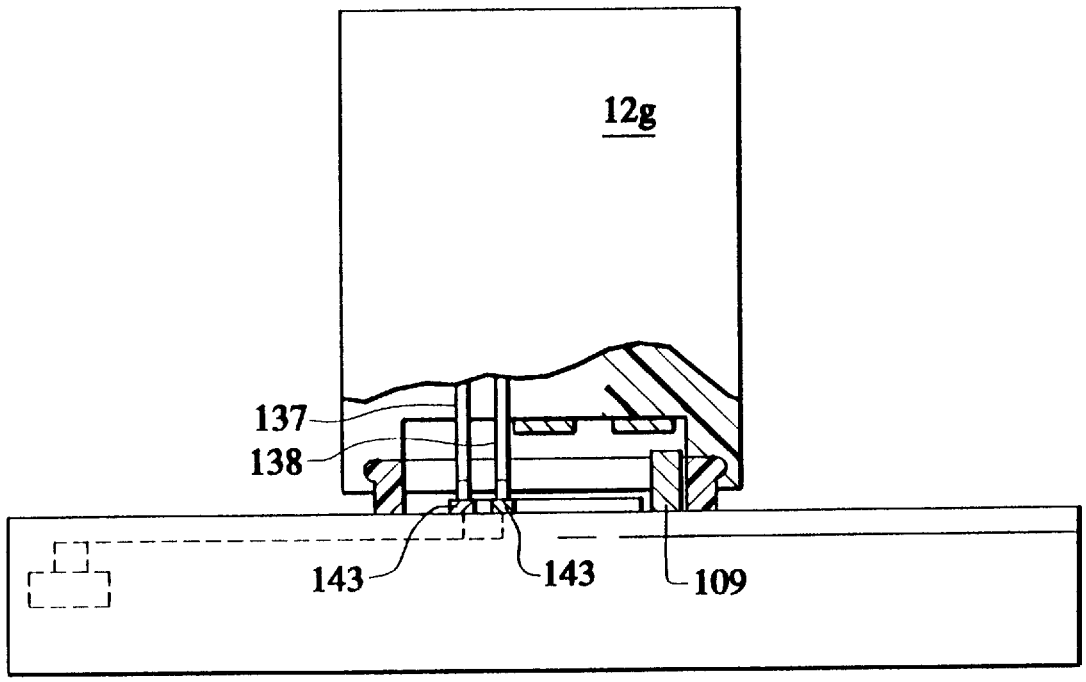
FIG. 22 is a broken out side view showing a modified form of the circuit control device of FIG. 21.
Figure 22A:
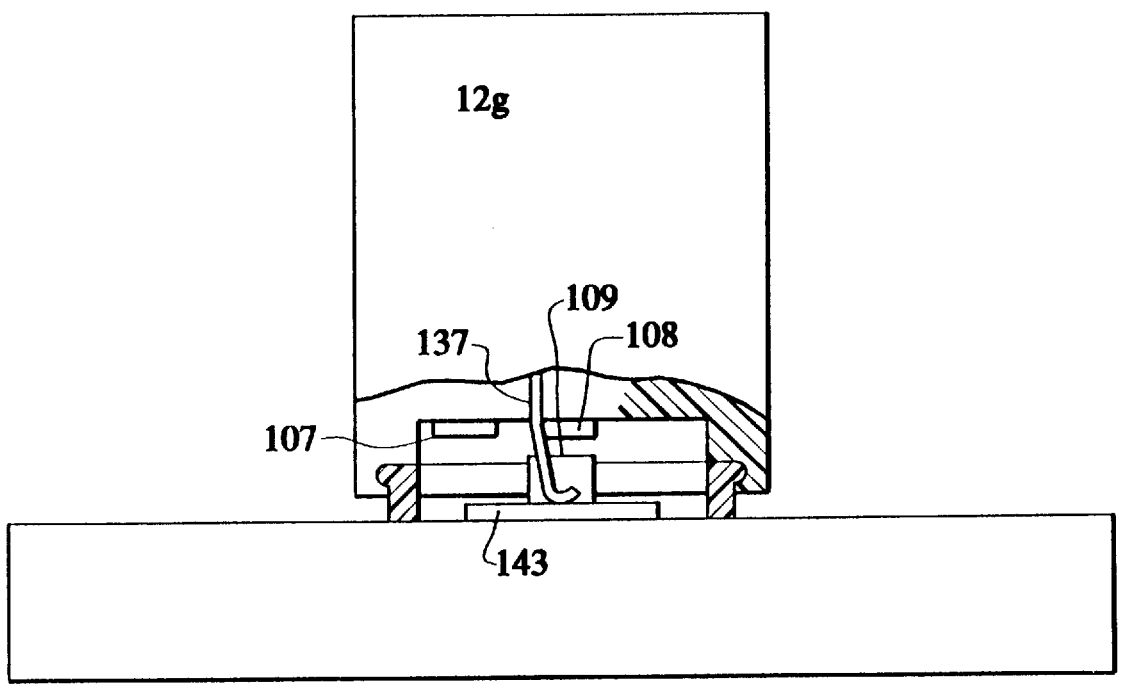
FIG. 22A is another broken out side view of the circuit control device of FIG. 22 as seen from a point of view that is at right angles to the point of view of FIG. 22.

Rings 139 and 141 may be replaced with a pair of annular bands 143 which are bonded to the front surface of cover plate 28g as shown in FIGS. 22 and 22A. The bands 143 are centered on the axis of rotation of the knob 12g and are of different diameter in order to be electrically isolated from each other. The wiper contacts 137 and 138 which extend from knob 12g are repositioned to bear against the bands 143. The conductive body 109 is bonded to cover glass 28g between the outermost band 143 and base member 31g. The control device of FIGS. 22 and 22A may otherwise be similar to the control device of FIG. 21.

Figure 23:
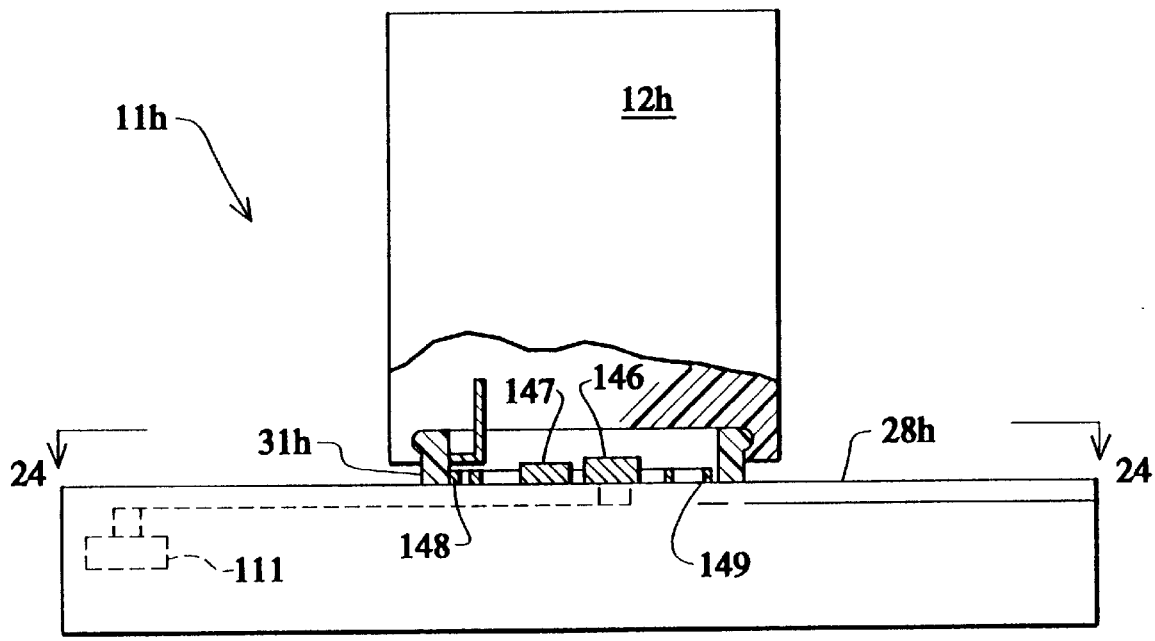
FIG. 23 is a broken out side view of another rotary knob type of electrical circuit control device which uses capacitive effects to sense and track turning of the knob.
Figure 24:
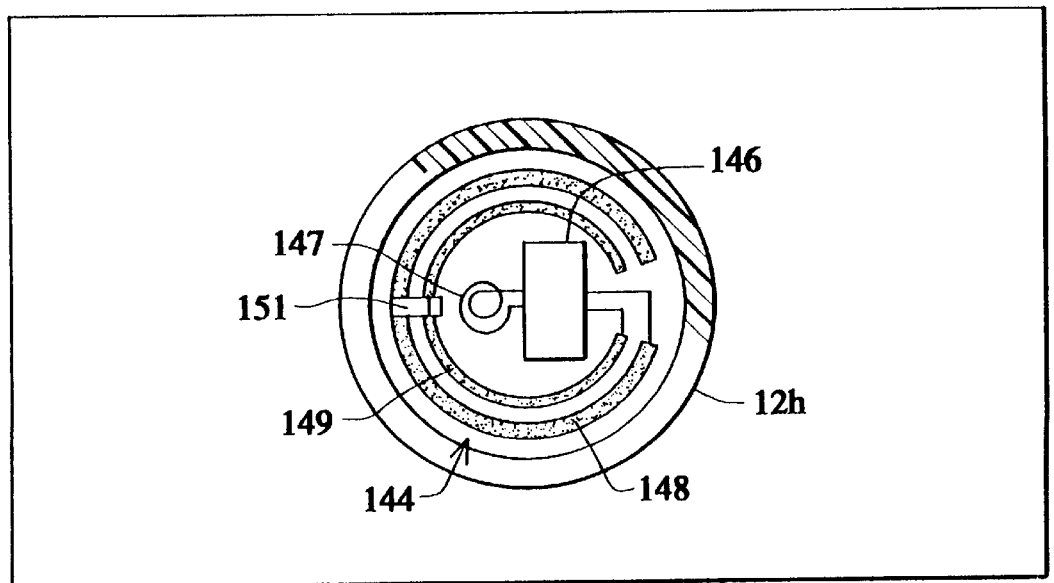
FIG. 24 is a plan section view of the circuit control device of FIG. 23 taken along line 24—24 thereof.

The rotational position of a knob or the like can be sensed by still other means. Referring jointly to FIGS. 23 and 24, a specialized form of capacitor 144 may be used for this purpose. The control device 11h of FIGS. 23 and 24 has a turnable knob 12h snap engaged on an annular base member 31 which is bonded to the front surface of the transparent cover plate 28h of a flat panel display 16h which components may be similar to the corresponding components of the previously described embodiments. An oscillator 146 circuit board is bonded to the face of cover plate 28h within the base member 31h. The inductive component of the resonant circuit of oscillator 146 is a spiral shaped coil 147 of conductive metal bonded to the surface of cover plate 28h within the base member 31h. Capacitor 144 is the capacitive component of the resonant circuit and is formed by two discontinuous circular traces 148 and 149 of electrically conductive material that are bonded to the front surface of the cover plate 28h. The traces 148 and 149 are each centered on the axis of rotation of knob 12h and are of different diameter in order to be spaced apart from each other. Each of the traces 148 and 149 has a width which is broadest at one end of the trace and which progressively diminishes along the length of the trace. The broadest ends of both traces 148 and 149 are adjacent to each other.

A conductive plate 151 is secured to the base of the turnable knob 12h and spans traces 148 and 149 in spaced apart relationship therewith, the plate having a width in the direction of travel of the plate that is substantially smaller than the length of the traces.

Traces 148, 149 and plate 151 jointly form a three plate capacitor the capacitance of which progressively decreases or increases as knob 12h is turned to travel the plate along the traces. This progressively changes the resonant frequency of oscillator 146 and each rotational position of the knob 12h is characterized by a different specific frequency that is used to identify the position and to track rotary motion of the knob 12h.

Figure 25:
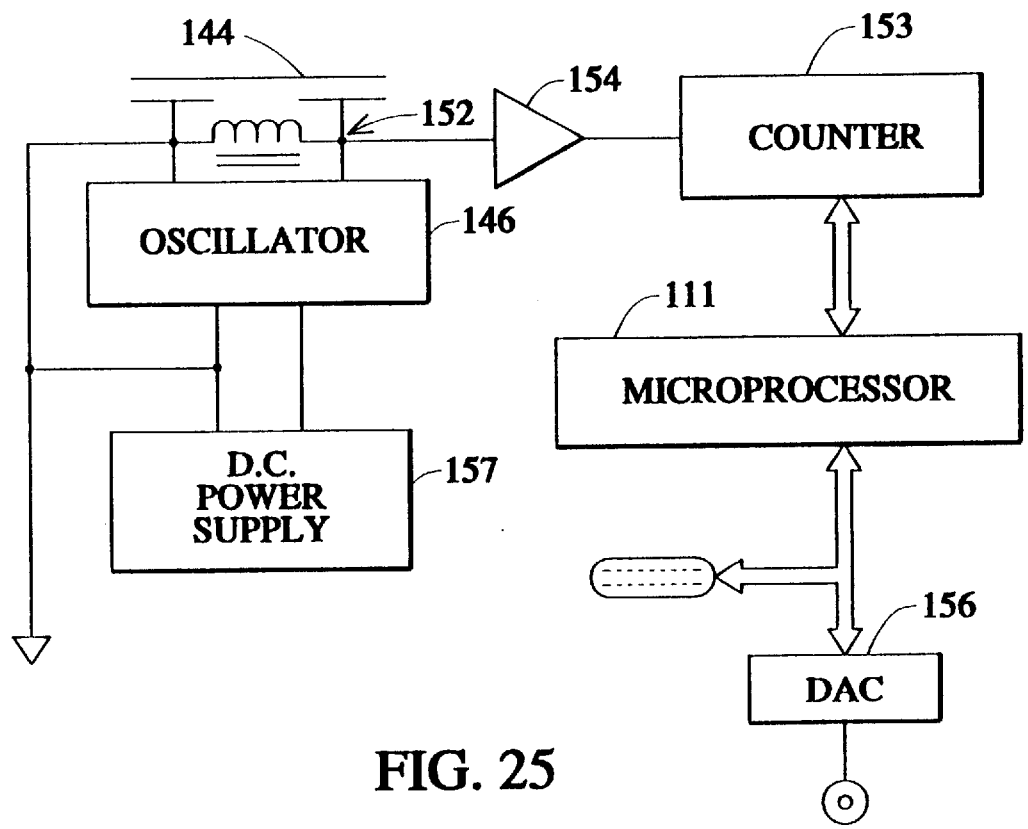
FIG. 25 is a schematic circuit diagram depicting electronic components of the circuit control device of FIGS. 23 and 24.
Figure 25A:
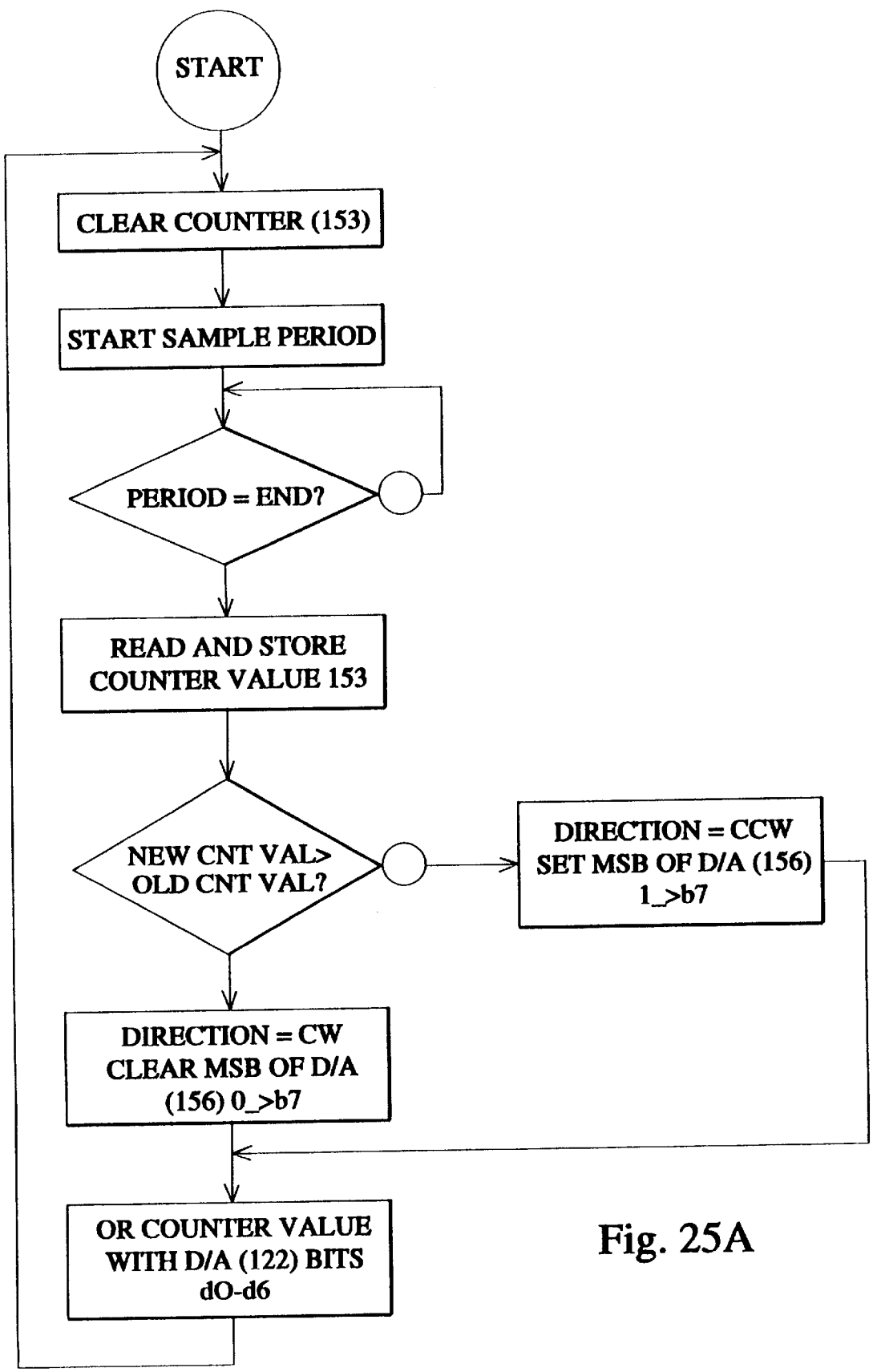
FIG. 25A is a flowchart program depicting operations performed by a digital data processor component of the circuit of FIG. 25.

Referring to FIG. 25, a circuit junction 152 between capacitor 144 and inductance coil 147 is coupled to a frequency cycle counter 153 through a buffer amplifier 154 which may be situated at the oscillator circuit board. Referring jointly to FIGS. 25 and 25A, a microprocessor 111, which may be within the marginal region of the flat panel display, cyclically reads the accumulated count in counter 153 and resets the counter in order to detect the current resonant frequency of the oscillator 146. The microprocessor 111 outputs a digital control signal which has a value that changes in response to changes of the frequency caused by changes in the angular setting of the turnable knob. The control signal may be delivered through a digital to analog converter 156 if the controlled electrical circuit is of a type that responds to variable voltage control signals. The microprocessor 111, counter 153 and a DC power supply 157 for the oscillator 146 are situated in the marginal region of the flat panel display.

The oscillator 146 of this example is of the harmonic type which has a resonant circuit formed by capacitor 144 and coil 147. The oscillator can also be of the relaxation type in which case coil 147 is replaced with a resistor.

Figure 26:
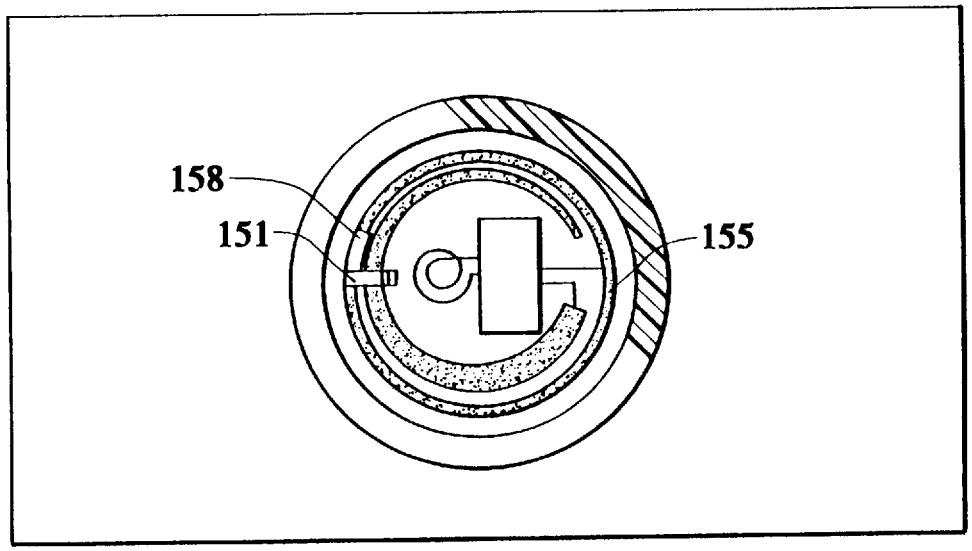
FIG. 26 is a plan section view corresponding generally to FIG. 24 while illustrating a modification of the control device thereof.

In a modified form of the capacitive control device one of the conductive traces of the capacitor 144 is replaced with a relatively thin circular band 155 of electrical conductor of uniform width as shown in FIG. 26. The movable capacitor plate 151 carries a wiper contact 158 which contacts and travels along the band 157. The control device of FIG. 26 may otherwise be similar to the control device of FIGS. 23 to 25.

Figure 27:
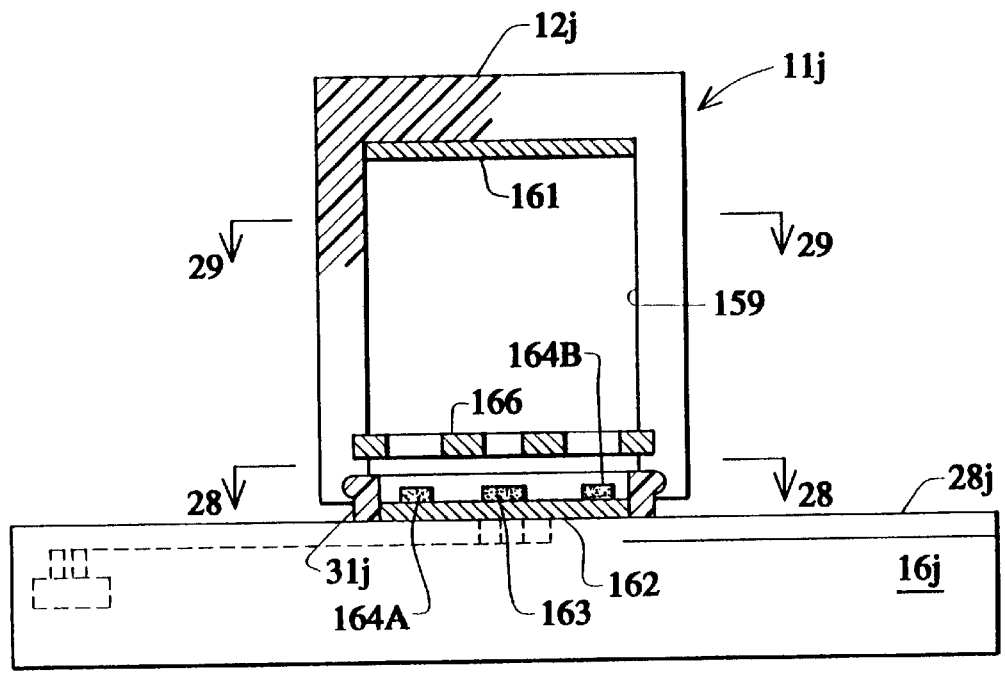
FIG. 27 is a broken out side view of another rotary knob type of electrical circuit control device which uses photoelectric effects to sense and track turning of the knob.
Figure 28:
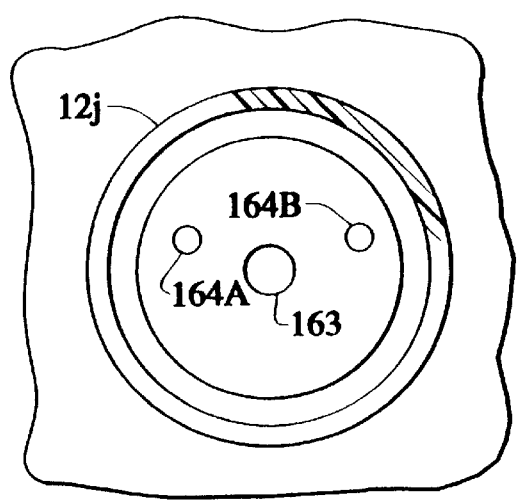
FIG. 28 is a cross section view taken along line 28—28 of FIG. 27.
Figure 29:
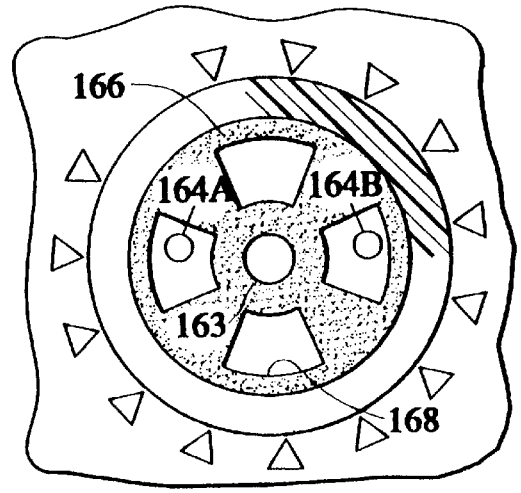
FIG. 29 is a cross section view taken along line 29—29 of FIG. 27.

Rotary motion of the control device knob can also be tracked and settings identified by photoelectric means. Referring jointly to FIGS. 27, 28 and 29, a control device 11j of this kind may have a turnable knob 12j snap engaged on an annular base member 31j at the face of a flat panel display 16j which components may be similar to those of previously described embodiments. The knob 12j has an interior chamber 159 which opens at the base of the knob and a mirror 161 is secured to the knob within the chamber. Mirror 161 is spaced outward from base member 31j and oriented to return light which is received from the region of the base member back towards that region.

A layer 162 of opaque material is bonded to the front surface of the transparent cover plate 28j within the base member 31j to prevent entry of external light into chamber 159. This objective can be met without the opaque layer 162 if the flat panel display 16j is conditioned to always present a solid black image at the location of the base member 31j regardless of what is being displayed at other locations.

An LED (light emitting diode) 163 or other light source is secured to the center of layer 162 to direct light towards mirror 161. Returned light is detected by two phototransistors 164A and 164B or other light sensors which are secured to layer 162 at opposite sides of LED 163, the photodiodes being equidistant from the axis of rotation of knob 12j. The angular spacing of the phototransistors 164A and 164B from each other, relative to the axis of rotation of the knob is less than 180°. Light in passage from LED 163 to the phototransistors 164 is modulated by an opaque disk 166 which extends across chamber 159 at a location between the mirror 161 and phototransistors 164. Disk 166 has an opening 167 or transparent region at its center to provide a light path from LED 163 to the mirror. The disk also has an annular array of uniformly spaced apart slots 168 or transparent zones through which reflected light is received by phototransistors 164. Slots 168 are shaped and positioned to create a quadrature code of the kind known to the art which enables a digital data processor to track rotary motion of a knob around a series of angular settings and to output a signal which is indicative of the current setting.

In this example there are four slots 168 each of which extends along 45° of arc relative to the axis of rotation and which are separated from each other by opaque regions of the disk 166 of similar arcuate length. Phototransistors 164A and 164B are positioned to create the response pattern which is depicted diagramatically in FIG. 29A and which enables a digital data processor to distinguish between 16 different positions of the knob 12j. At a first position, shown in FIG. 29, both phototransistors 164A and 164B are illuminated. When the knob is turned clockwise 22.5°, only phototransistor 164B is illuminated. Further turning by the same amount blocks light from both phototransistors 164A and 164B. Upon further turning by the same amount, only phototransistor 164A is illuminated. This pattern is continually repeated as clockwise turning of the knob 12j is continued. Reversed turning of the knob 12j creates a reversed pattern of phototransistor illuminations.

Figure 30:
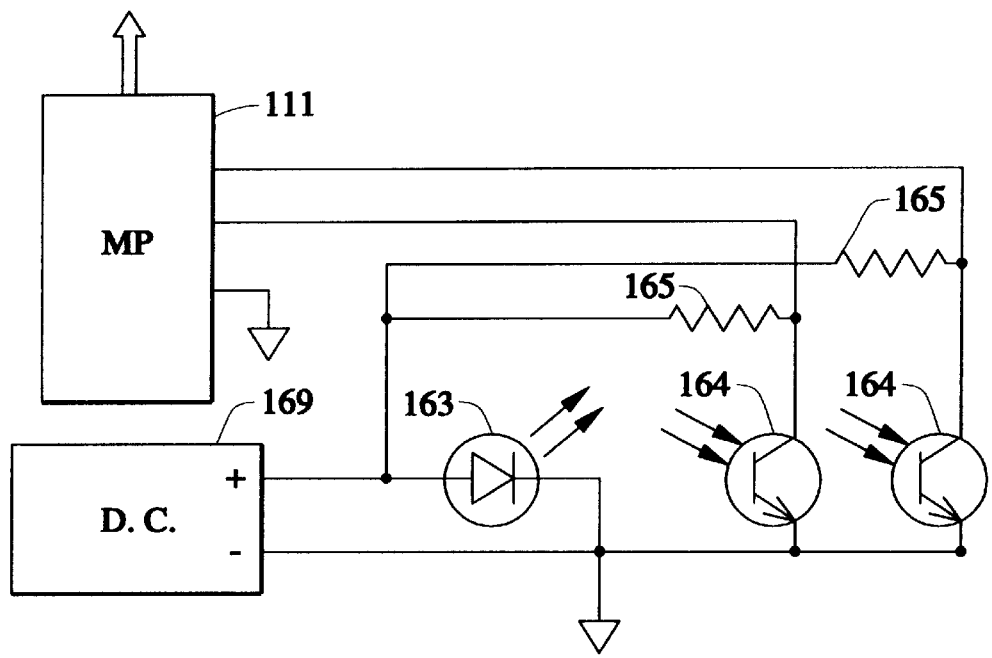
FIG. 30 is a schematic circuit diagram showing electronic components of the circuit control device of FIGS. 27 to 29.
Figure 30A:
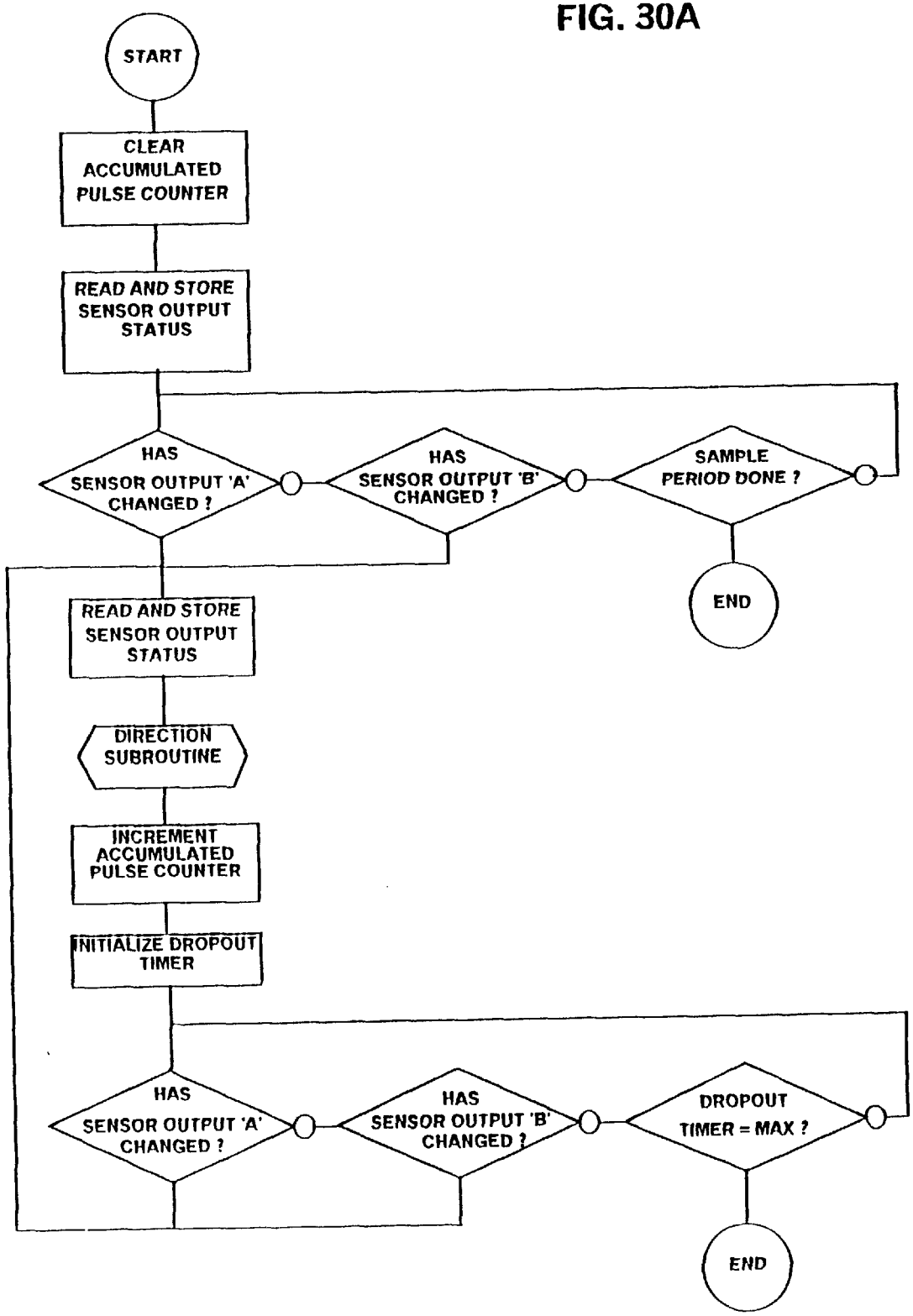
FIG. 30A is a flowchart program depicting operations performed by a digital data processor component of the circuit of FIG. 30.
Figure 30B:
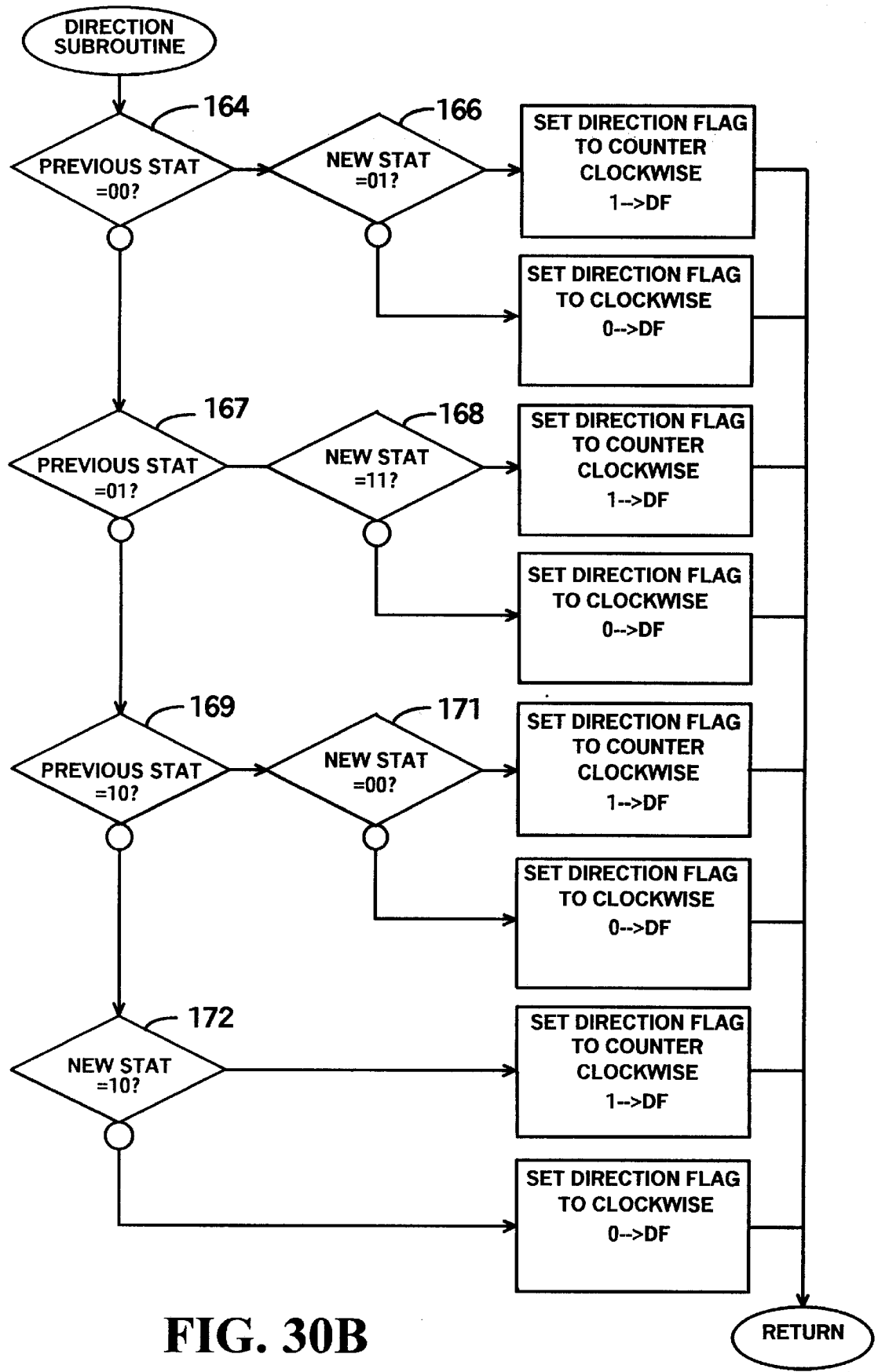
FIG. 30B is a flowchart depicting a subroutine performed by the program of FIG. 30A.
Figure 29A:
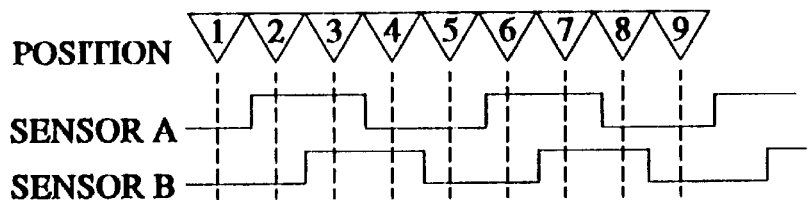
FIG. 29A is a diagram depicting output signal changes which occur at a pair of photoelectric detectors as the rotary knob of the control device of FIGS. 27 to 29 is turned through a series of successive settings.

Referring now to FIGS. 30 and 30A, each phototransistor 164 is connected between a separate port of a microprocessor 111 and system ground in series with separate resistors 165. This causes the voltage at each such microprocessor port to change from a high status to a low status each time that a pulse of light is received by the phototransistor that is connected to the port. As depicted in FIG. 30A, the microprocessor tracks turning of the knob by counting such changes of status in an additive and subtractive manner. Prior to each incrementing of the count the program executes a direction subroutine, depicted in FIG. 30B, to determine if the knob motion is clockwise or counter clockwise. Referring jointly to FIGS. 29A and 30B, the four possible combinations of the status of the two phototransistors 164A and 164B (sensor A and sensor B) can be represented as 00, 01, 10 and 11. If the status combination changes from 00 to 01 or from 01 to 11 or from 10 to 00 or from 11 to 10 then the knob motion is counter clockwise and the program increments the count in a subtractive manner. Any other change in the status combination is indicative of clockwise knob motion and the count is incremented in an additive manner.

Referring again to FIGS. 27 to 29, the resolution of the control device 12j can be increased by providing disk 166 with a greater number of the slots 168.

LED 163 is energized by a DC power supply 169 which may be located in the marginal region of the flat panel display.

Figure 33:
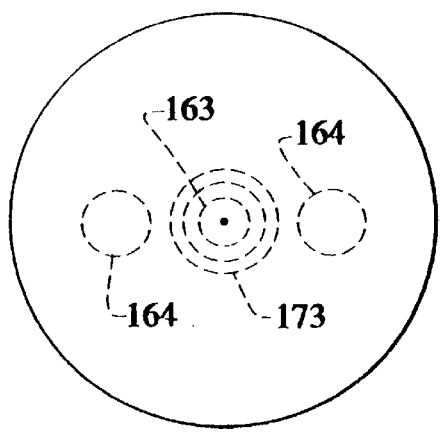
FIG. 33 is a top view of the control device of FIG. 32.
Figure 35:
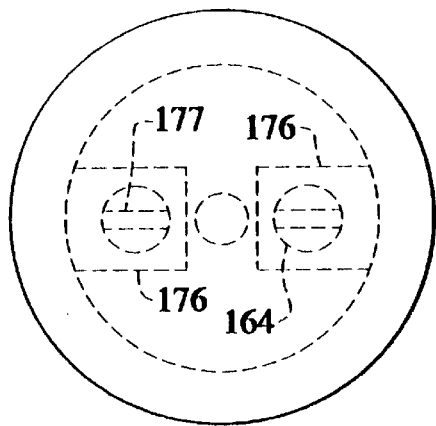
FIG. 35 is a top view of the device of FIG. 34.
Figure 32:
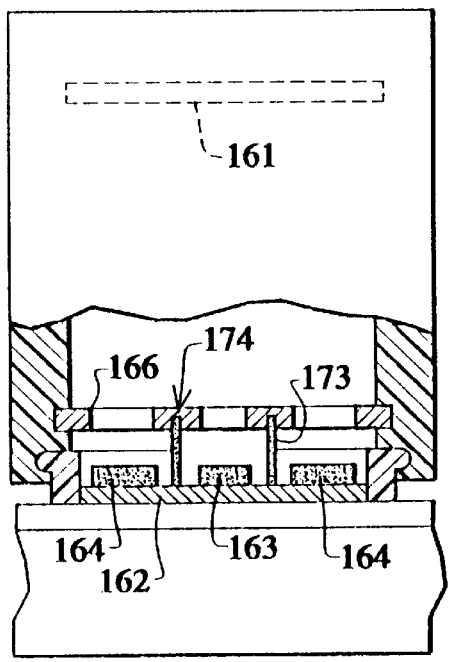
FIG. 32 is a broken out side view of a rotary knob type of electrical circuit control showing a first modification of the circuit control of FIGS. 27 to 31.
Figure 34:
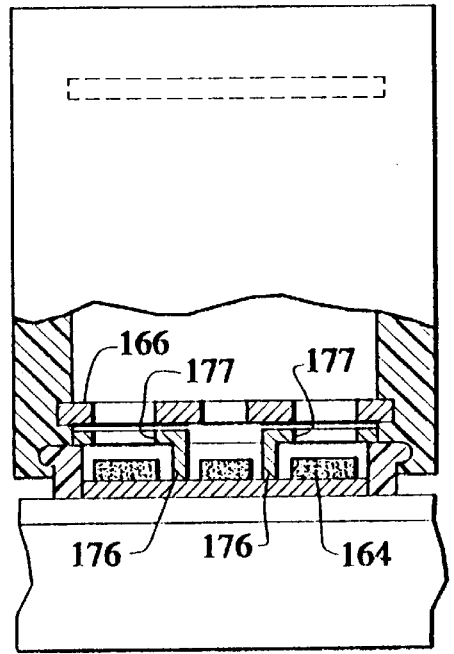
FIG. 34 is a broken out side view of a rotary knob type of electrical circuit control showing another modification of the circuit control of FIGS. 27 to 31.

Referring now to FIGS. 32 and 33, LED 163 can be encircled by an opaque cylindrical light barrier 173 which extends from the opaque layer 162 up into a slot 174 in the light modulating disk 166 to optically isolate the two phototransistors 164 from each other. A similar result can be effected by providing an opaque housing 176 around each phototransistor 164 as is shown in FIGS. 34 and 35. Each housing 176 has a thin slot 177 which faces the light modulating disk 166 to admit pulses of light into the housing. The slotted housings 176 have the further beneficial effect of causing the phototransistors 164 to receive light from only one of the slots 168 at any given time.

Figure 31:
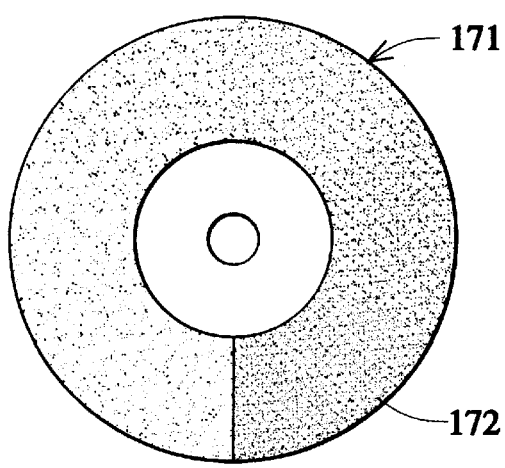
FIG. 31 depicts a rotary disk which is a component of the circuit control device of FIGS. 27 to 30.
Figure 31A:
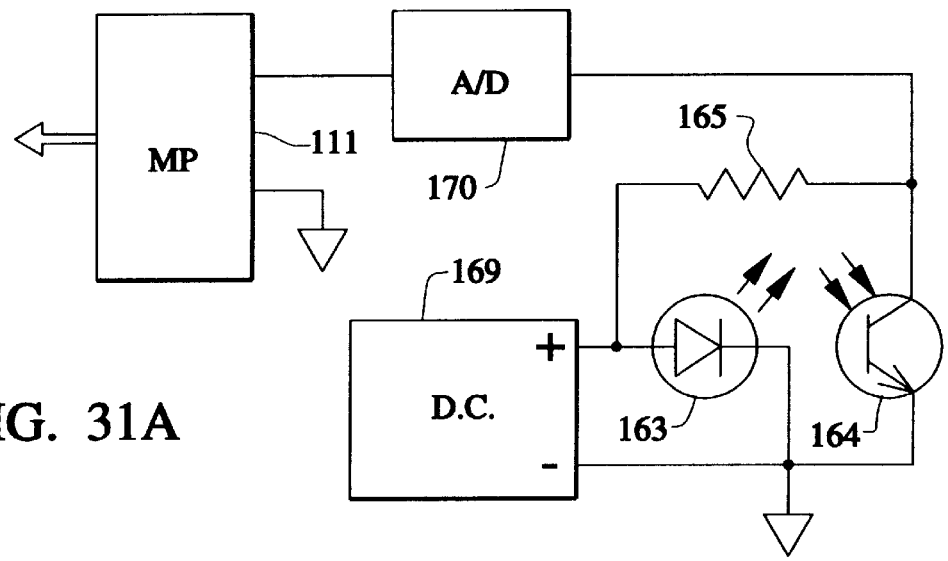
FIG. 31A depicts a modification of the electrical circuit of FIG. 30.

As shown in FIG. 31A, only one phototransistor 164, photodiode or the like is needed if the light modulating disk 166 of FIGS. 27 and 29 is replaced with a disk 171 of the form shown in FIG. 31. Instead of slots disk 171 has an annular band 170, centered on the axis of rotation, that is of maximum light transmissivity at one location and which becomes progressively less light transmissive at successive other locations around the band. The output of the single phototransistor is then a function of the angular orientation of the knob.

Figure 37:
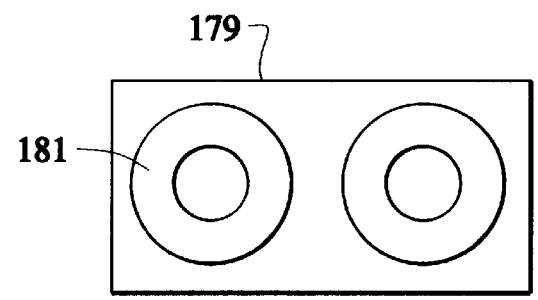
FIG. 37 is a frontal view of the wafer of FIG. 36.
Figure 36:
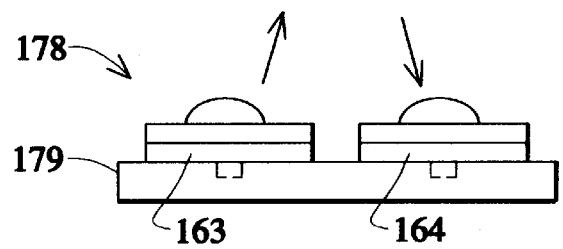
FIG. 36 is a side view of a photoelectric source and detector wafer which is used in certain embodiments of of the invention.

The control device of FIGS. 27 to 35 uses an LED 163 and phototransistors 164 which are separate components separately secured to the opaque layer 162. Referring now to FIGS. 36 and 37, the control device and other control devices to be hereinafter described can be more economically manufactured in large numbers by integrating these components into a single photoelectric chip or wafer 178. For this purpose, an LED 163 and phototransistor 164 are bonded to a flat base 179 and are spaced apart thereon. Both the LED 163 and the phototransistor 164 have one of a pair of lenses 181 bonded thereto, the lenses being formed to focus light from the LED at a point located a predetermined distance away and to focus light which is reflected back from that point at the phototransistor 164.

Figure 39:
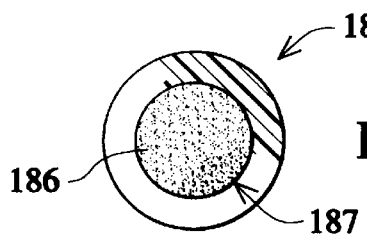
FIG. 39 is a cross section view taken along line 39—39 of FIG. 38.
Figure 38:
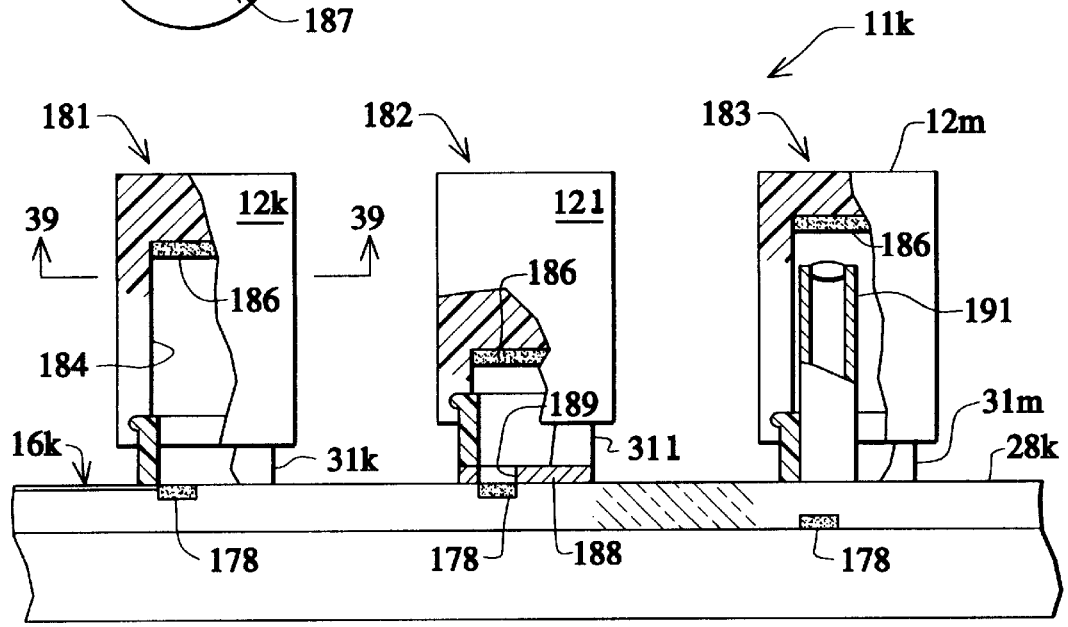
FIG. 38 is a broken out side view of a bank of circuit control device of the rotary knob type and which use photoelectric effects to sense and track turning of the knobs.

FIGS. 38 and 39 depict another electrical circuit control device 11k in which a bank of three potentiometers 181, 182 and 183 are secured to the transparent cover plate 28k of a flat panel display 16k within the image display area. The potentiometers 181, 182 and 183 each have a turnable knob, 12k, 121, and 12m respectively, snap engaged on annular base members, 31k, 31l and 31m respectively in the previously described manner. The base members 31k, 31l and 31m are spaced apart and each is bonded to the cover plate 28k by an adhesive. Each of the potentiometers 181, 182 and 183 uses one of the above described photoelectric wafers 178 to sense changes in the rotational position of the knob of the potentiometer to enable synthesis of a variable control signal for a controlled electrical circuit.

The knob 12k of the first potentiometer 181 has an interior chamber 184 and a mirrored disk 186 is bonded to the knob within the chamber. Disk 186 parallel in parallel relationship with cover plate 28k, is spaced apart from the cover plate and is centered on the axis of rotation of knob 12k. A circular band 187 of light reflecting material is present on the surface of disk 186 that faces cover plate 28k, the band being centered on the axis of rotation of the disk. The density of the reflective material and thus the reflectivity of the material progressively changes from a minimum to a maximum at successive locations around the band, the zone of minimum light reflection being adjacent to the zone of maximum light reflection.

A photoelectric wafer 178 of the previously described kind is embedded in the front surface of cover plate 28k at a location at which the focal point of the light beam that is emitted by the wafer is at the band 187 of light reflective material. Thus light is reflected back to the wafer 178 and the reflected light has an intensity that increases as knob 12k is turned in one direction and decreases when the knob is turned in the opposite direction. This enables detection of the direction of turning of the knob and detection of the current angular orientation of the knob in order to produce a control signal that is indicative of the position of the knob. The electrical circuit which is coupled to wafer 178 for this purpose may be similar to that previously described with reference to FIG. 30A.

In the second potentiometer 182 of control device 11k an opaque mask 188 is disposed between the base member 31l and cover plate 28k so that light which is produced within the flat panel display 16k will not affect the output of the photoelectric wafer 178. The mask 188 has an opening 189 which overlays the wafer 178 to enable passage of light between the wafer and the mirrored disk 186. The lenses of the photoelectric wafer 178 of potentiometer 182 have a shorter focal length than the corresponding components of the first potentiometer 181. Thus the mirrored disk 186 of the second potentiometer 182 is closer to the wafer 178. Except as described above, the second potentiometer 182 is similar to the first potentiometer 181.

In the third potentiometer 183 of control device 11k, the photoelectric wafer 178 is embedded in the back surface of the transparent cover plate 28k in position to view the mirrored disk 186 through an opaque tube 191 which extends outward from cover plate 28k within the base member 31m and knob 12m. If the disk 186 is beyond the focal point of the lens of wafer 178 a supplementary lens 192 situated at the outer end of tube 191 focuses the light at the disk. If cover plate 28k is formed of glass as in this example, the base member 31m can be unitized with the cover plate by forming the base member of glass and by bonding it to the cover plate with solder glass.

The third potentiometer 183 may otherwise be similar to the first potentiometer 181.

Figure 41:
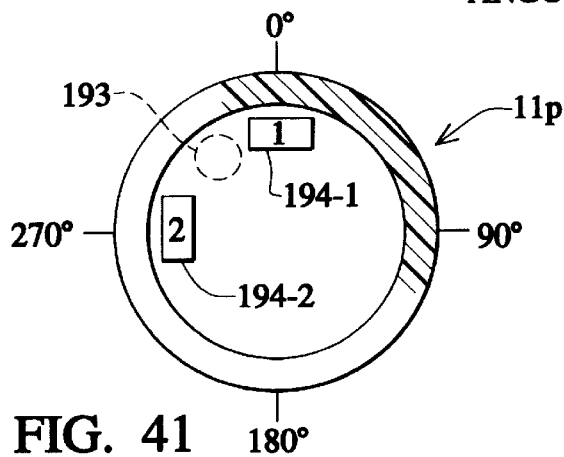
FIG. 41 is a section view taken along line 41—41 of FIG. 40.
Figure 40:
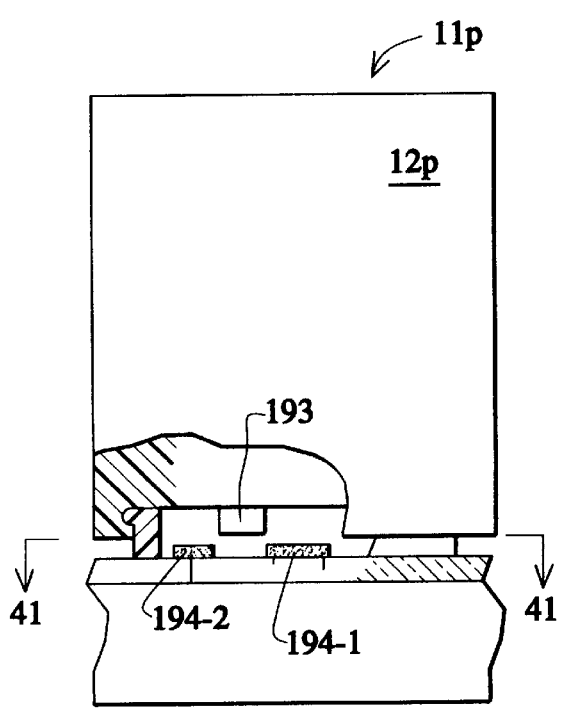
FIG. 40 is a broken out side view of a rotary knob type of electrical circuit control device which uses the Hall effect to sense and track turning of the knob.

Referring to FIGS. 40 and 41 in conjunction, a magnet 193 and a pair of analog Hall effect sensors 194-1 and 194-2 may also be used to sense changes in the angular setting of a turnable knob 12p and thereby enable generation of control signals that vary in response to turning of the knob. The control device 11p may be mechanically identical to the radio frequency embodiment previously described with respect to FIGS. 16 and 17 except insofar as the Hall effect sensors are substituted for the two oscillator coils 107 and 108 of the previously described embodiment and the conductive body 109 of the previously described embodiment is replaced with magnet 193.

Figure 42:
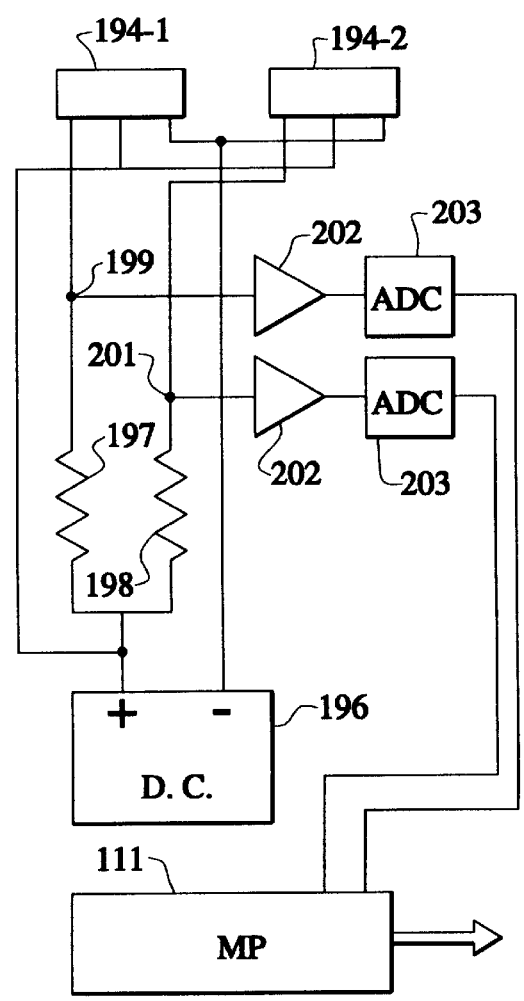
FIG. 42 is a schematic circuit diagram showing electronic components of the circuit control device of FIGS. 40 and 41.

The electrical resistance of each Hall effect sensor 194 decreases as the magnet 193 approaches the sensor during turning of the knob 12p and increases as the magnet recedes from the sensor. Referring to FIG. 42, the first Hall effect sensor 194-1 is connected across the positive and negative terminals of a DC voltage source 196 in series relationship with a first resistor 197 and the second sensor is connected across the terminals in series with a second resistor 198. The first sensor 194-1 and resistor 197 form a first voltage divider in which the voltage at a circuit junction 199 between the sensor and resistor changes when the resistance of the sensor changes. The other sensor 194-2 and the second resistor 198 form a second voltage divider having a similar circuit junction 201 at which the voltage changes when the resistance of the sensor changes.

Referring to FIGS. 40 and 41 in conjunction, the two Hall effect sensors 194 of this example of the invention are positioned at locations which are 90° apart relative to the axis of rotation of knob 12p. The angular spacing of the two sensors may have other values in other examples of the invention. The first sensor 194-1, also identified as sensor 1 in the drawings, is in this example situated at the 0° angular position of the knob 12p. The second sensor 194-2, also identified as sensor 2 in the drawings, is at the 270° position and thus the output signals of the two sensors are 90° out of phase as may be seen in FIG. 43 wherein curved line 1A represents the varying output signal of the first sensor and curved line 2A represents the output signal of the second sensor.

Referring jointly to FIGS. 40 to 43, the two voltage values which are present at circuit junctions 199 and 201 are used to identify the rotational orientation of knob 12p. Each circuit junction 199 and 201 is coupled to a separate port of a microprocessor 111 through a separate one of a pair of buffer amplifiers 202 and a separate one of a pair of analog to digital signal converters 203. The microprocessor 111 converts the output signal 1A of the first sensor 194-1 to a control signal which varies as a function of the angular position of knob 12p. The control signal may be caused to vary in a linear manner or to follow some other desired response curve by establishing an internal lookup table in the microprocessor 111 which contains assigned values for the control signal at each angular setting of the knob 12p. The microprocessor 111 replaces the actual signal values that are produced at circuit junction 199 with the assigned values, this method of producing a desired response curve being hereinafter described in more detail.

Figure 43:
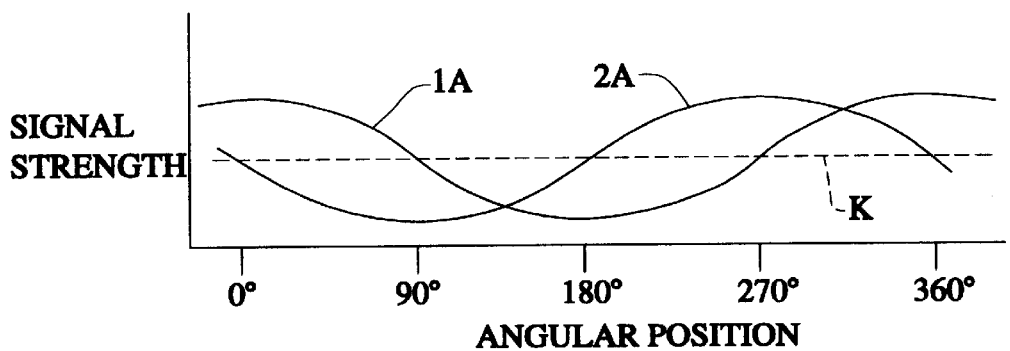
FIG. 43 is a graphical depiction of variations of output signal strength as a function of the angular position of the rotary knob of the circuit control device of FIGS. 40 to 42.

As depicted in FIG. 43, the output signal 1A of the first sensor 194-1 has a different magnitude at each position of the knob 12p as it is turned from the 0° position to the 180° position. The signal 1A value then returns through the same range of signal values as the knob 12p is turned further in the same direction from the 180° position to the 360° (0°) position. Microprocessor 111 uses the output signal 2A from the second sensor 194-2 to determine if a first output signal 1A of a particular magnitude represents a position in the 0° to 180° range or a position which is greater than 180°. The second sensor output signal 2A has a particular value, designated as K in FIG. 43, when the knob 12p is at the 180° position. Signal 2A is smaller than K when the knob 12p is between the 0° and 180° positions (at which time magnet 193 is at the right half of FIG. 41) and is greater than K when the knob is in between the 180° and 360° positions (at which time magnet 193 is at the left half of FIG. 41). As depicted in flowchart form in FIG. 42A, the microprocessor consults a lookup table to translate the current value of signal 1A into an assigned value representing the current angular position of the knob within a range of 0° and 180° which assigned value is designated by letter D in FIG. 42A. If the second sensor signal 2A is greater than K at that time, the microprocessor outputs a control signal equal to 360° minus D. Otherwise, the outputted control signal is equal to D itself.

Figure 43B:
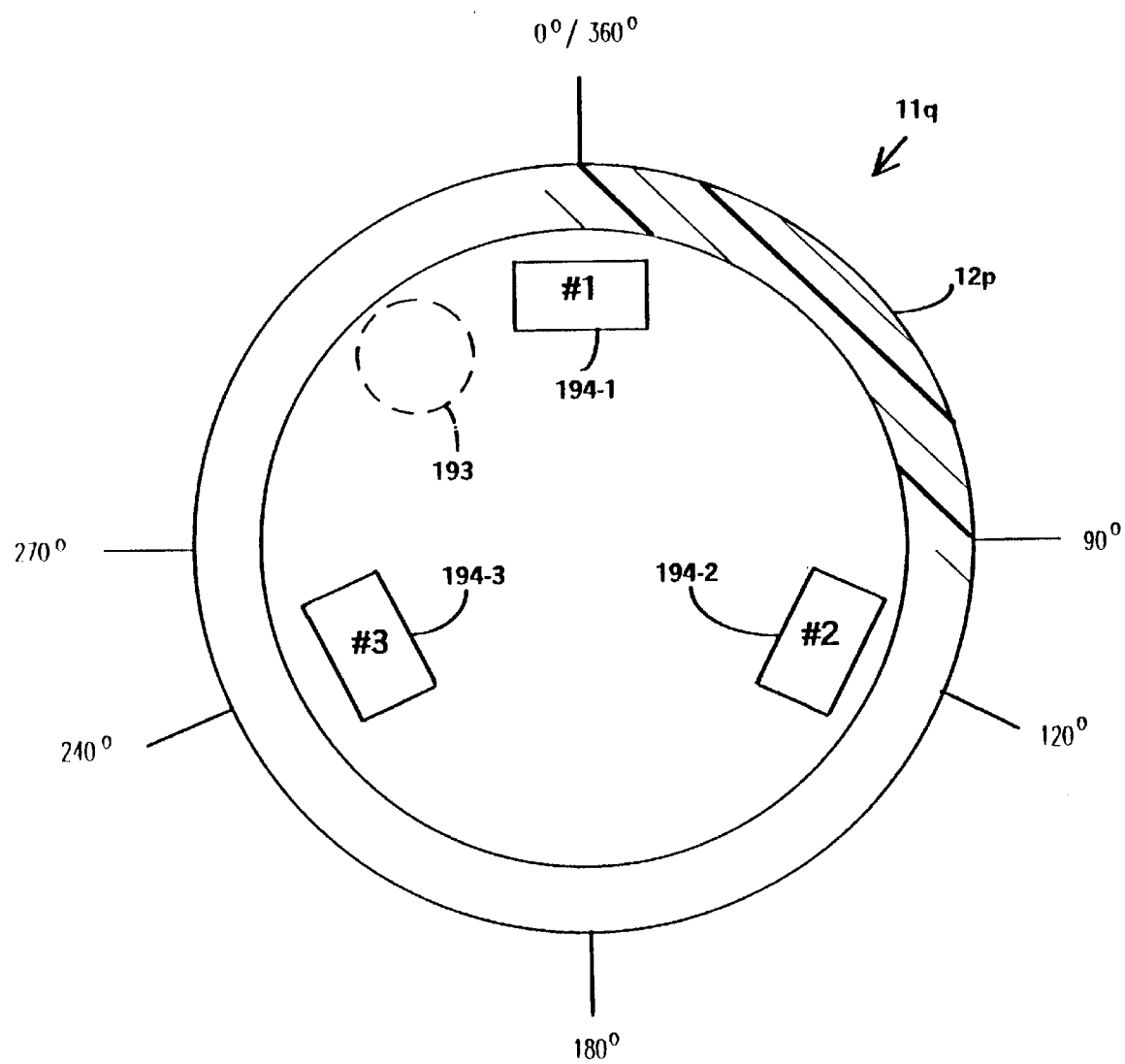
FIG. 43B is a cross section view, corresponding generally to FIG. 41, showing a modified form of the Hall effect circuit control device of FIGS. 40 to 43.

Referring to FIG. 43B, a greater number of the Hall effect sensors may be present in order to increase precision in the tracking of motion of the knob 12p. In this example three analog Hall effect sensors 194-1, 194-2 and 194-3 are situated at angular intervals of 120° around the axis of rotation of the knob 12p, the location of sensor 194-1 again being the 0° position of the knob 12p, sensor 194-2 being at the 120° position and sensor 194-3 being at the 240° position. The physical structure of the control device 11q may otherwise be similar to that of the previously described Hall effect control device 119 of FIGS. 40 and 41.

Figure 43C:
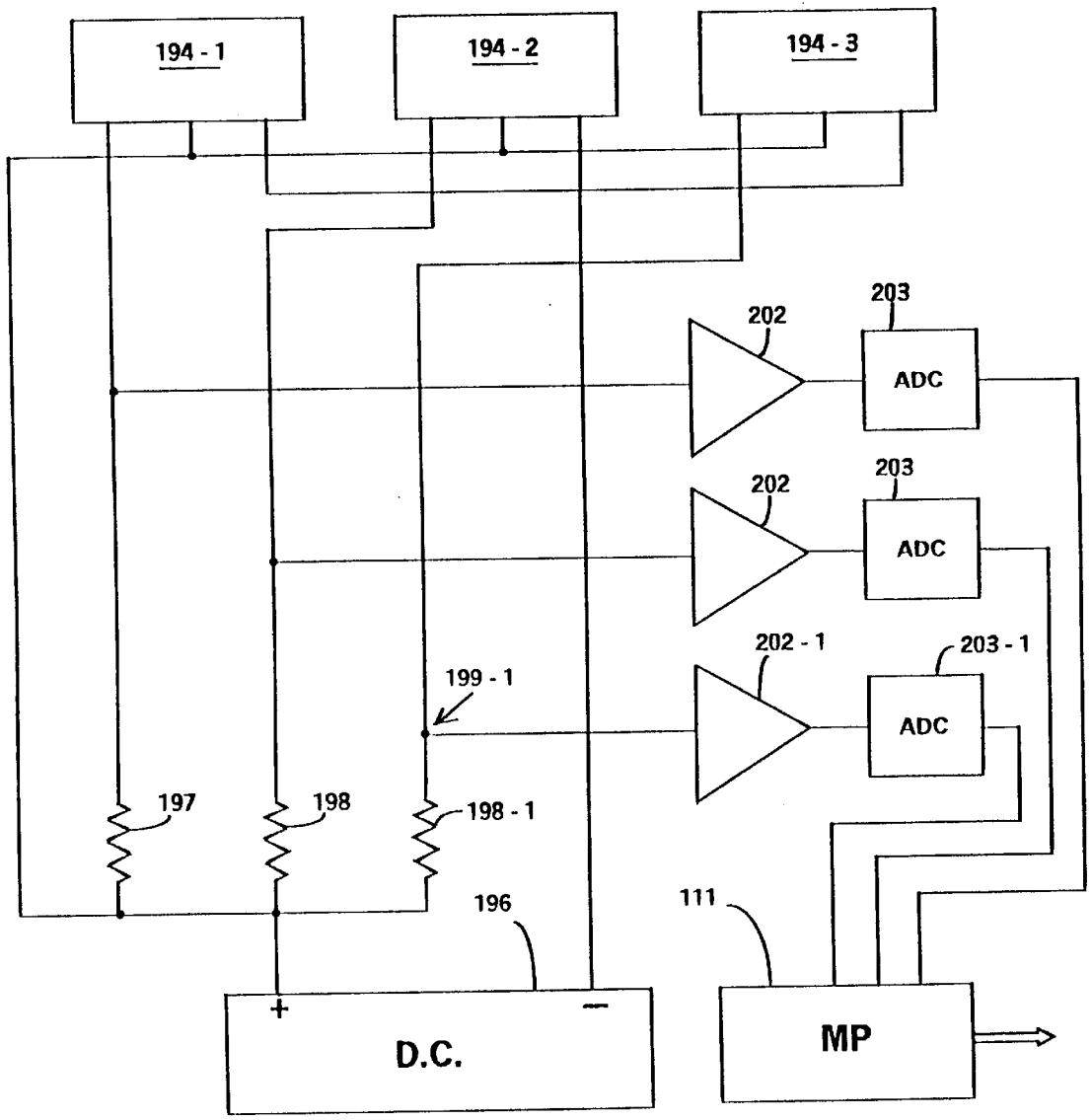
FIG. 43C is a schematic circuit diagram showing electronic components of the circuit control device of FIG. 43B.

Referring to FIG. 43C, the electrical circuit of the control device 11q may also be similar to that previously described with reference to FIG. 42 except insofar as the third sensor 194-3 is connected to the DC voltage source 196 and to microprocessor 111 in a manner similar to the connections of the first two sensors therewith. Thus the third sensor 194-3 is connected across the positive and negative terminals of DC voltage source 196 in series relationship with a third resistor 198-1. A circuit junction 199-1 between the third sensor 194-3 and third resistor 198-1 transmits the output signal of the third sensor to the microprocessor 111 through another buffer amplifier 202-1 and another analog to digital signal converter 203-1.

Figure 43D:
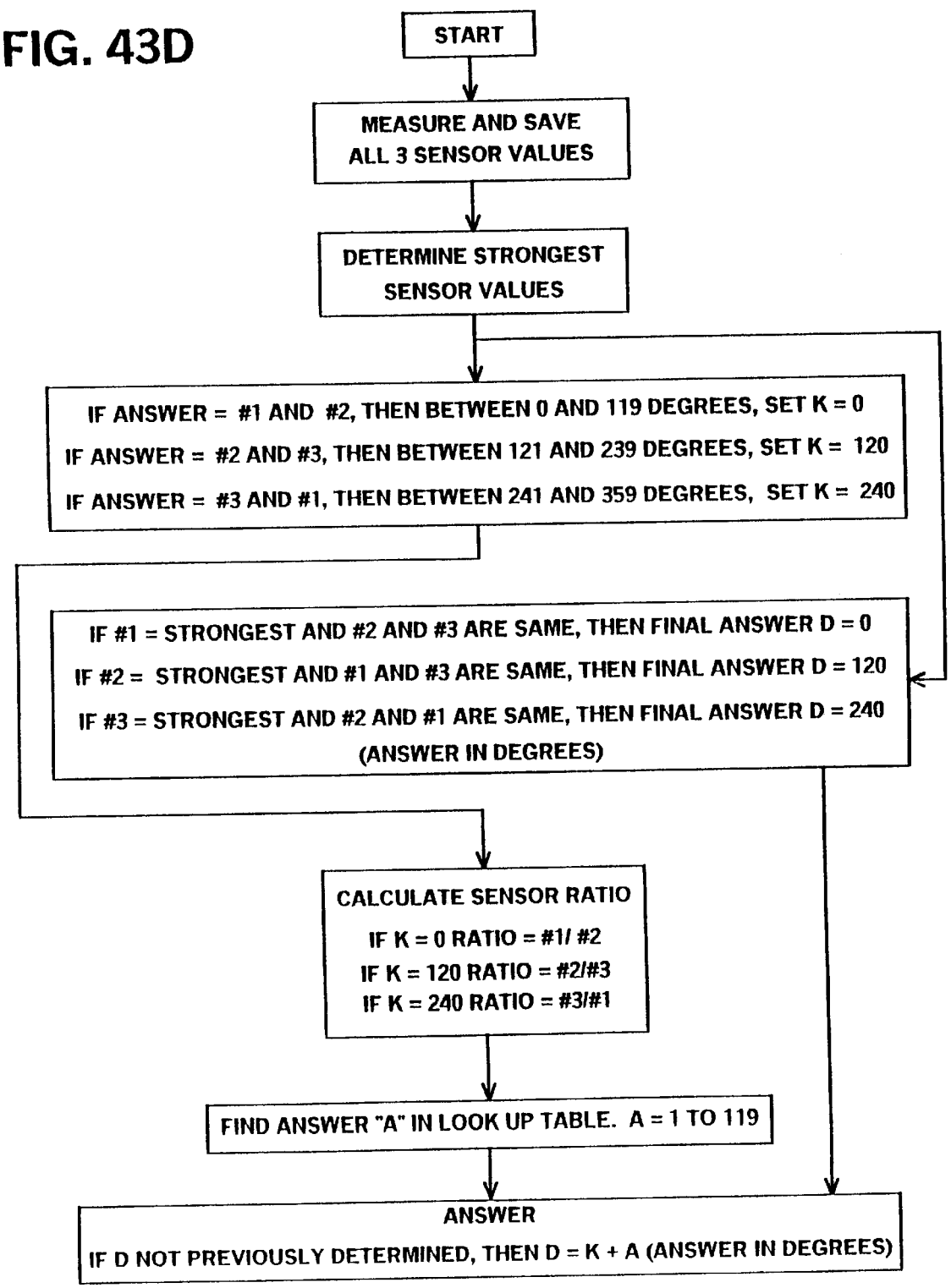
FIG. 43D is a flowchart program depicting operations performed by a digital data processor component of the circuit of FIG. 43C.

Referring jointly to FIGS. 43D and 41, the microprocessor 111 is programmed to monitor the strength of the output signals of each of the sensors 194-1, 194-2 and 194-3 which sensors in this example have equal sensitivities. If one of the signals is strongest and the other two are equal to each other than the magnet 193 is at the location of the sensor with the strongest signal. At other times the magnet 193 is between the locations of the two sensors which are producing the strongest signals. The microprocessor 111 detects the exact location between the sources of the two strongest signals by computing the ratio of those two signals which ratio progressively changes as the magnet moves away from one such source and towards the other. The ratio typically does not change in a linear manner. The microprocessor 111 corrects for this by referring to an internal look up table in which each ratio value is correlated with the actual angular position of the knob 12p that produces that ratio value.

Figure 42A:
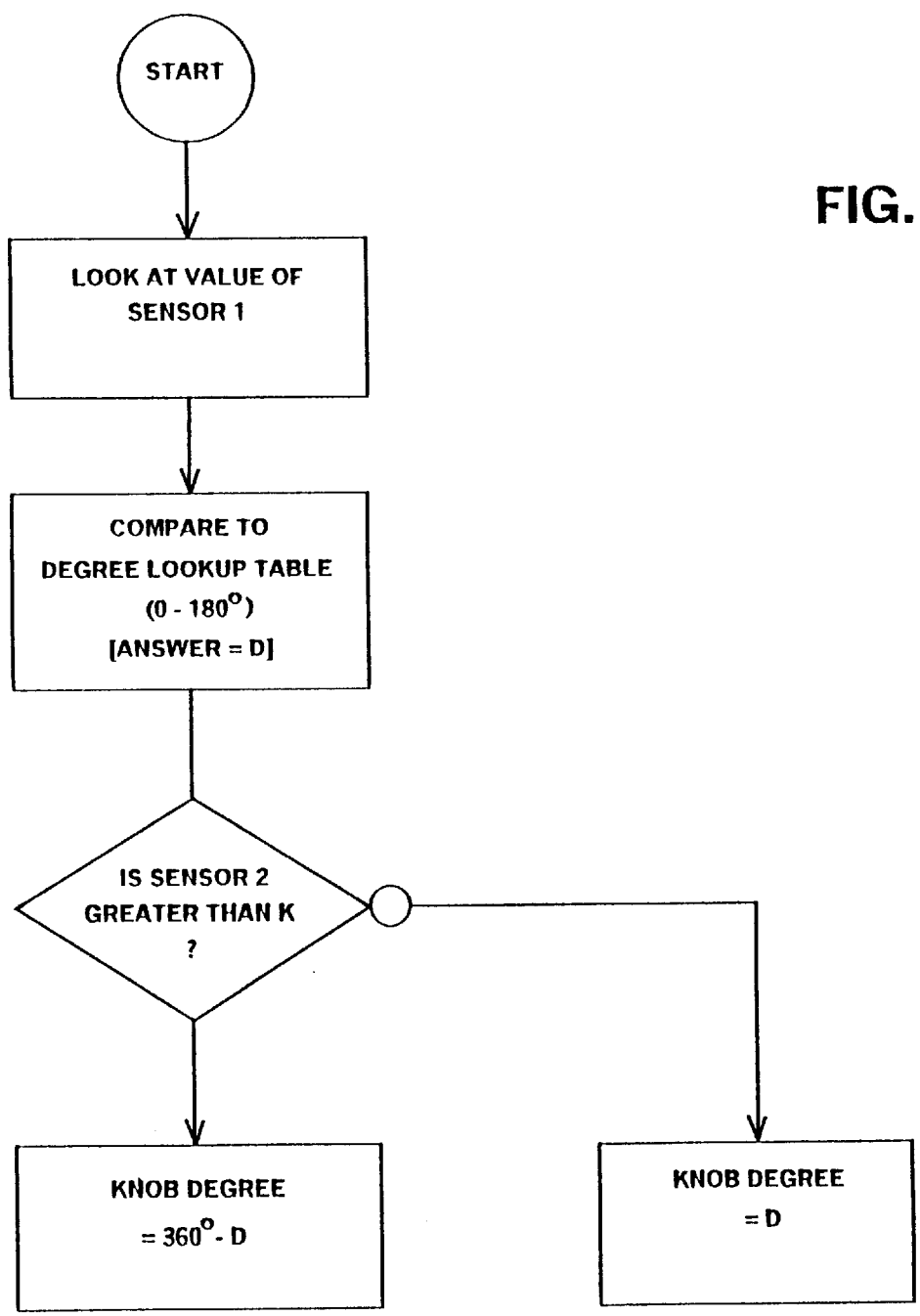
FIG. 42A is a flowchart program depicting operations performed by a digital data processor component of the circuit of FIG. 42.

The microprocessor 111 or other data processor can be programmed to revert to the two sensor mode of operation previously described with reference to FIG. 42A in the event of failure of one of the three sensors 194-1, 194-2 or 194-3.

Upon power-up, both the control device 11p of FIGS. 40 to 42 and the control device 11q of FIG. 43B can detect a change in the setting of the knob that has been made during a period when the power was off.

Figure 44:
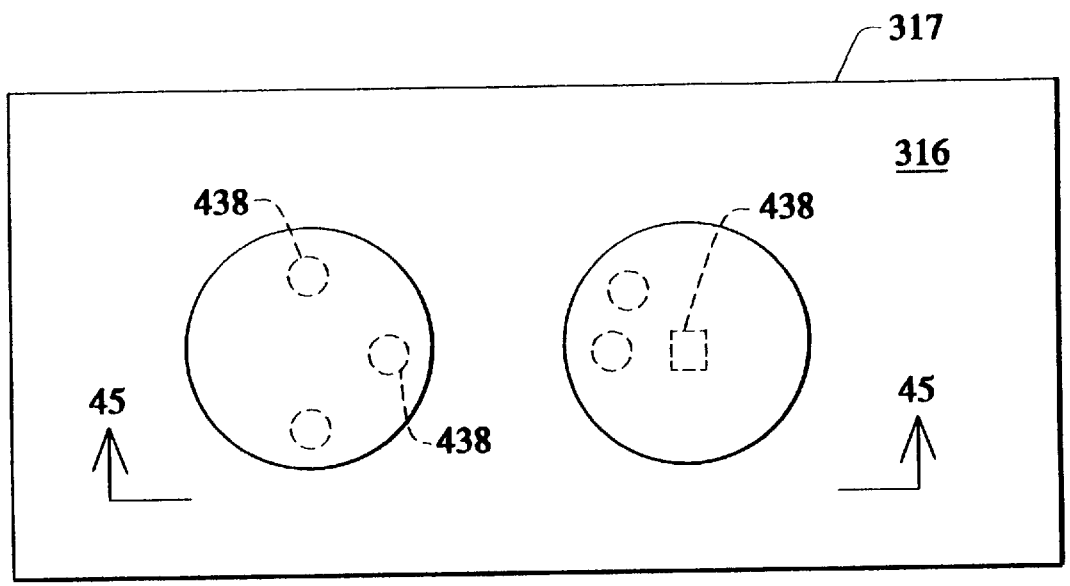
FIG. 44 is a frontal view of a control panel having a plurality of control devices in accordance with another embodiment of the invention.
Figure 45:
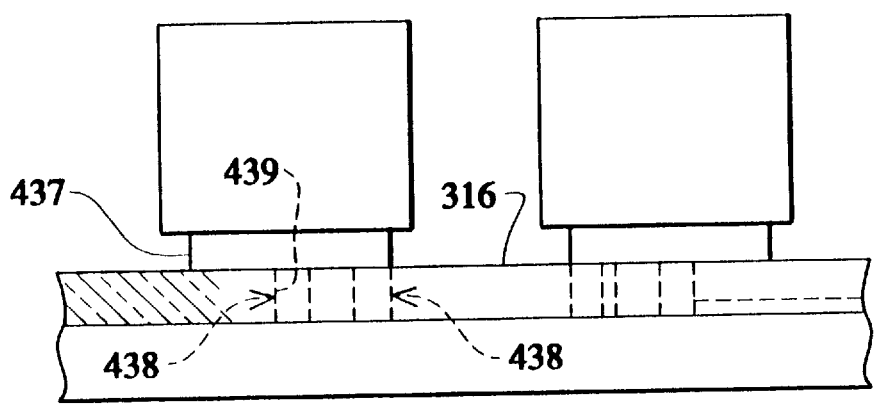
FIG. 45 is a cross section view taken along line 46—46 of FIG. 44.

Referring jointly to FIGS. 44 and 45, the control devices which have been previously described have a base member, such as base member 437, which is bonded to the front surface of the transparent cover plate 316 of the flat panel display 317. It can be advantageous if the base member 437 has one or more protrusions 438 which extend into or through the cover plate 316 at conforming openings 439 in the plate. This resists lateral forces on the control devices that might tend to detach them from the display. The protrusions 438 can be formed of metal to provide the hereinbefore described electrical connections to conductors at the back surface of cover plate 316. In instances where more than one control device is to be bonded to the same flat panel display 317, the bases 437 can each have protrusions 438 which are arranged in a different pattern and/or which have different shapes to assure that each control device is bonded to the display 317 at the correct location for the particular control device.

Figure 46:
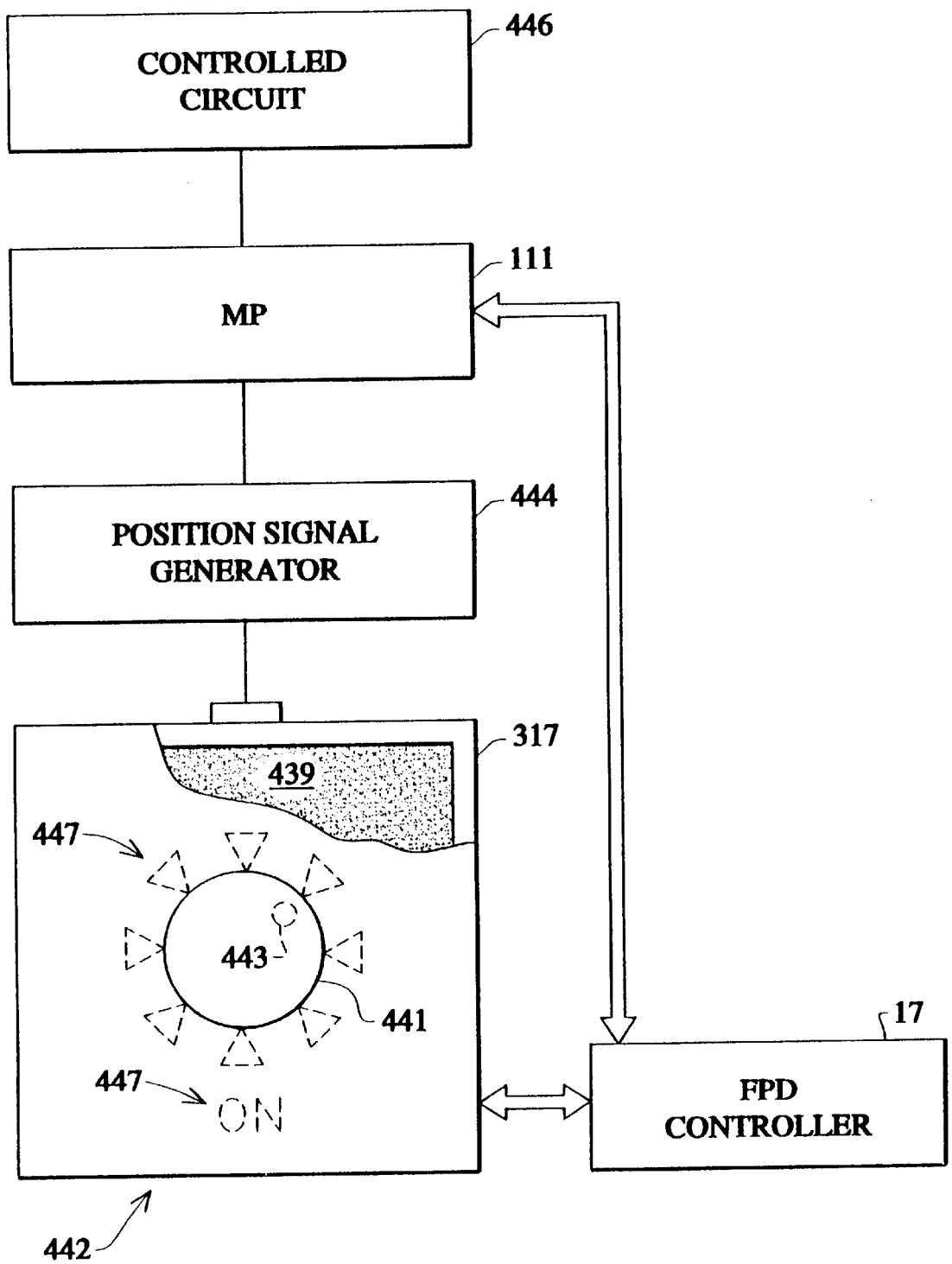
FIG. 46 is a broken out frontal view of a rotary knob type of electrical circuit control which uses a magnetic pad to sense turning of the knob and in which certain electronic components are shown in schematic form.
Figure 48:
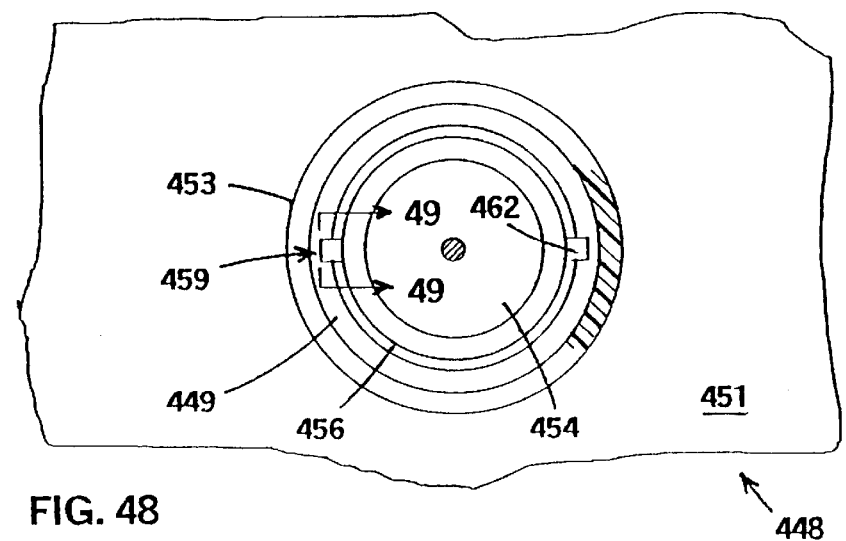
FIG. 48 is a section view taken along line 48—48 of FIG. 47.

Referring to FIG. 46, rotary movement of the knob 441 of a circuit control device which is secured to the face of a flat panel display 317 can be tracked by a magnetic pad 439 of the known design which is bonded to the back surface of the display. The control devices 442 of this embodiment may be similar to any of the previously described rotary knob control devices except that the electronic components in the knobs and knob bases are not needed. In the present embodiment a small magnet 443 is embedded in the knob 441 at a location which is offset from the axis of rotation of the knob. Movement of the magnet 443 is sensed by the pad 439 and a signal indicative of the current rotational orientation of the knob 441 is produced by a magnetic pad position signal generator 444 which may be of the known circuit configuration. The microprocessor 111 outputs a control signal to the controlled circuit 446 in the. previously described manner wherein the control signal has a magnitude determined by the rotational orientation of knob 441. The microprocessor 111 also causes the flat panel display controller 17 to provide graphics 447 at the flat panel display 317 that are indicative of the current setting of the control device.

In each of the above described circuit control devices both the knob and base member are situated in front of the supporting panel and electrical components of the devices are contained within the knob and base at the front of the panel. The described knob motion sensing means enable the devices to have a compact configuration that is conducive to the situating of the devices within the image display area of a flat panel display. The control device construction also facilitates maintenance and repairs as all components are accessible at the front of the supporting panel by simply detaching the knob from the base member. Embodiments of the invention in which electrical components are embedded in or are carried by the knob itself, such as the control device of FIGS. 21 and 22 for example, can be quickly and easily repaired by someone who is unskilled in electrical repairs by simply removing the knob and replacing it with a new one.

In the previously described circuit control devices rotary movement of the knob between a series of different settings produces a control signal having a value that progressively changes during the course of the knob movement. In some of these control devices the original control signal value at successive settings of the knob does not change in a linear manner nor follow any of the other response curves, such as a logarithmic curve for example, that are customary in control devices. This effect results from the geometry of the novel knob motion sensing means. The control device of FIGS. 16 to 18, the devices of FIGS. 19 and 20, the device of FIGS. 21 and 22 and the device of FIGS. 40 to 43 are examples of control devices which originally produce a control signal that does not vary in any of the standard manners in response to turning of the knob.

As has been heretofore described in connection with the specific embodiments, a microprocessor or other digital signal processor compensates for the irregularity of the original control signal by storing an assigned value in association each initial value of the signal that is produced at successive settings of the control. The control device is conditioned for this by turning the knob to each of its settings and entering the desired assigned value for the control signal at each setting into a look-up table in the signal processor. Thereafter the processor responds to movement of the knob by converting the original signal values to the associated assigned values. The converted signal is then used as the control signal for the controlled circuit.

This method of signal processing can be used to impart any desired response curve to successive settings of the control without regard to the actual response curve of the knob movement sensing means.

In others of the previously described circuit control devices the response curve can be determined by shaping a particular component to produce the desired curve. For example, the output of the circuit control device of FIGS. 5 and 6 can be linearized by forming the resistive trace 37 to have a uniform degree of electrical resistance at successive locations along its length. The assigned signal value method can also be applied control devices of this kind in order to relax manufacturing tolerances and thereby enable more economical production of such devices. Use of assigned signal values compensates for manufacturing irregularities in the shape of resistors or other components.

The method can also prolong the useful life of circuit control devices. If changes occur in the control signal at one or more settings of the control over a period of time due to wear or other causes, the control can be repositioned at those settings and a new assigned value can be entered into the look-up table of the signal processor for each such setting.

The method is not limited to use with circuit controls which are disposed on the face of an image display device nor to controls of the type which have a turnable knob. It is equally applicable to controls having knobs which move in a different manner such as, for example, knobs which are slid along a linear path as in linear potentiometers or faders.

As previously described, locating electronic components of a control device in front of the panel which supports the device greatly facilitates maintenance and repair of the control as the components can be accessed simply by detaching the turnable knob from the control rather than by opening a housing and performing operations at the back of the panel. FIGS. 48 to 51 depict another embodiment of the invention which is particularly advantageous in this respect.

The control device 448 of FIGS. 48 to 51 again has an annular base member 449 affixed to a transparent overlay plate 451 which is disposed against the face of a flat panel display 452 and a turnable knob 453 is snap fitted on the base member in the previously described manner. The control signal producing means 454 are attached to a removable carrier 456 which is fitted within the base member 449 and which is easily accessed by simply removing the detachable knob 453 from the base member.

Figure 47:
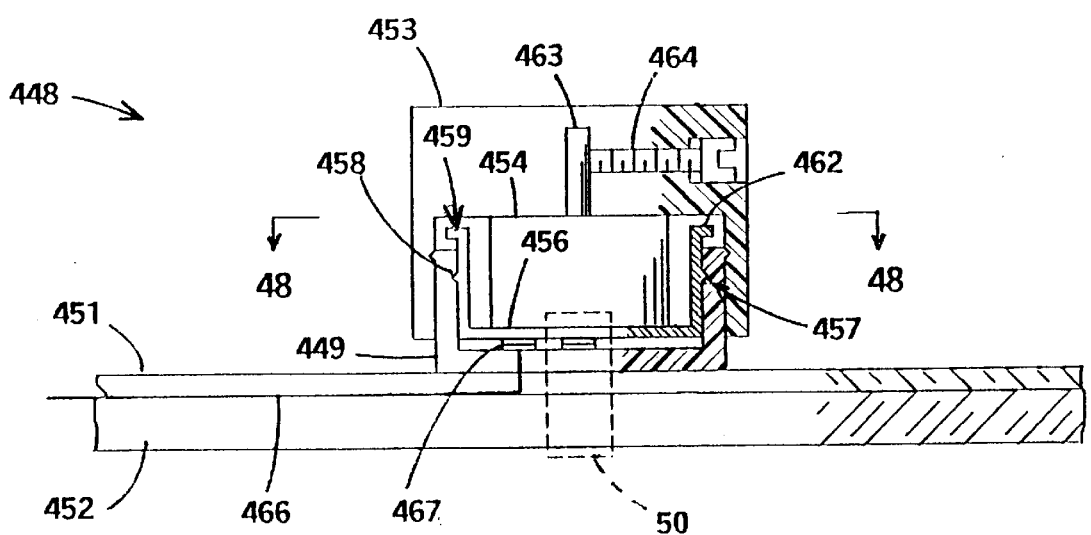
FIG. 47 is a section view of another rotary knob circuit control wherein electronic components are contained in a replaceable insert.
Figure 49:
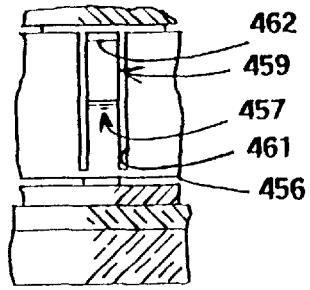
FIG. 49 is a section view taken along line 49—49 of FIG. 48.

The carrier 456 of this example is a cup shaped member having an outside diameter conforming with the inside diameter of the base member 449. Referring to FIGS. 47 and 49 in particular, small protrusions 457 at opposites sides of the carrier 456 snap engage in conforming openings 458 in the inner wall of base member 449. Each such protrusion 457 is located on a deflectable tab 459 portion of the carrier side wall that is formed by slots 461 in the side wall at each side of the protrusion. Thus the protrusions 457 may be disengaged from the openings 458 by finger pressure on the free ends 462 of the tabs 459. The free ends 462 are preferably right angled relative to the other portions of the tabs 459 to facilitate manual squeezing of the tabs.

The control signal producing means 454 of this example is a rotary potentiometer of conventional internal design. The turnable shaft 463 of the potentiometer extends into a conforming passage in knob 453 of the control device 448 and a set screw 464 extends radially within the knob and bears against the shaft to constrain the shaft to turn with the knob. Alternately the shaft 463 may be engaged by a screw which extends along the axis of the knob 453 from the center of the face of the knob.

The conventional potentiometer 454 of this example may be replaced with any of the knob motion sensing circuits that have hereinbefore been described.

Figure 50:
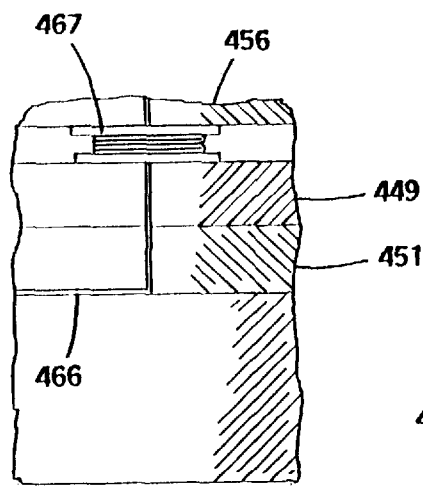
FIG. 50 is an enlarged view of the portion of FIG. 47 that is enclosed by dashed rectangle 50 therein.
Figure 51:
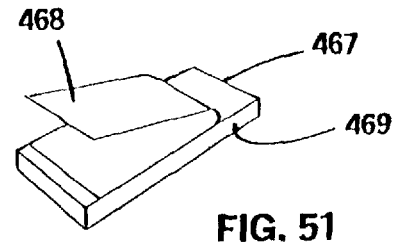
FIG. 51 is a perspective view of a spring contact component of the apparatus of FIGS. 47 to 50.

Referring to FIGS. 47, 50 and 51 in particular, electrical connection of the potentiometer 454 to signal and power conductors 466 that extend through the bases of base member 449 and overlay plate 451 and along the back of the overlay plate is provided for by spring contacts 467. At the location of each such conductor 466 one spring contact 467 is secured to the base of base member 449 and another is secured to the base of carrier 456 in position to contact and bear against each other when the carrier is fitted into the base member. As best seen in FIG. 51, each such contact 467 has a resilient member 468 of generally U-shaped configuration when in an uncompressed state with one arm of the member being disposed against and secured to a conductive pad 469.

A single one of the spring contacts 467 may be used at each conductor 466 if the other spring contact is replaced with a conductive pad.

Figure 52:
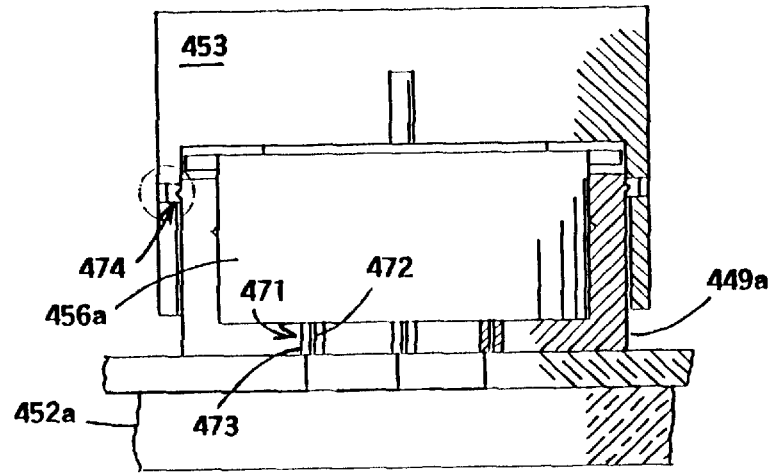
FIG. 52 is a section view of a modification of the apparatus of FIGS. 47 to 50.

FIG. 52 depicts a modification of the control device in which the spring contacts are replaced with pin connectors 471. Pins 472 which extend from the base of carrier 456a enter conductive sleeves 473, which are embedded in the base of the base member 449, as the carrier is being inserted into the base member.

Figure 53:
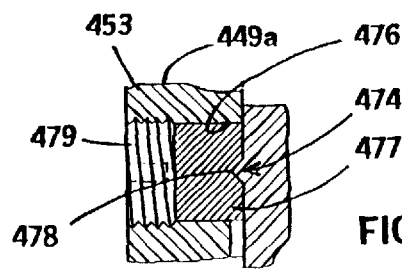
FIG. 53 is an enlarged view of the area of FIG. 52 that is encircled by dashed line 53 thereof.

The knob 453 of the embodiment of FIG. 52 does not snap engage on the base member 449a. Referring jointly to FIGS. 52 and 53, an outward protruding annular lip 474 encircles the outer wall of base member 449a. Radially directed passages 476 extend through the side wall of knob 453 at opposite sides of the knob and at locations which cause the passages to be directed toward lip 474 when the knob is engaged on base member 449a. A slidable clamp 477 is disposed in each such passage 476 and has a groove 478 which receives an adjacent portion of the lip 474 when the clamp is pushed into abutment with the knob 453. A set screw 479 within a threaded outer portion of each passage 476 is turnable with a screwdriver or the like to selectively force the clamp 477 into abutment with the knob 453 at which position the clamp holds the knob on base member 449a while allowing rotary motion of the knob. Opposite turning of set screw 479 allows the clamps 477 to retract from the knob 453 when the knob is to be detached from the base member 449a. The portion of the side wall of knob 453 which extends towards the image display device 452a from the location of lip 474 has an inside diameter which is at least equal to the diameter of the lip. This form of engagement of the knob 453 and base member 449a may be substituted for the previously described snap-on engagements in instance where the face of the flat panel display 452a is fragile and the force which is applied to effect a snap-on engagement might create a risk of breakage.

Except as described above, the embodiment of FIGS. 51 to 53 may be similar to the embodiment of FIGS. 47 to 50.

Figure 55:
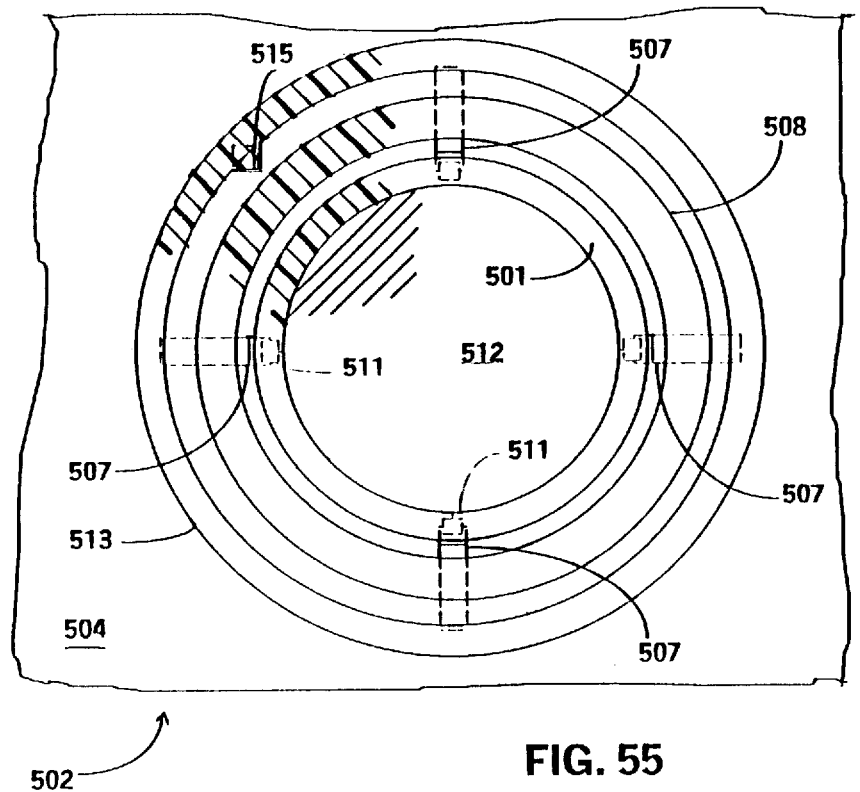
FIG. 55 is a cross section view taken along line 55—55 of FIG. 54.
Figure 54:
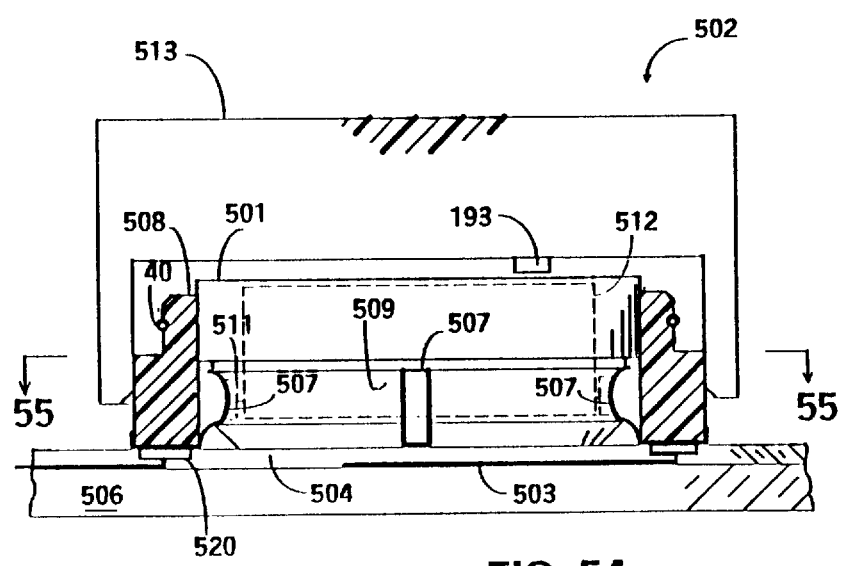
FIG. 54 is a section view of another embodiment of the invention in which electronic components are contained within a replaceable insert.

Referring jointly to FIGS. 54 and 55, electrical connections between a replaceable carrier 501 for electronic components of a rotary knob type of circuit control 502 and conductors 503 which extend along the transparent cover plate 504 of the flat panel display 506 can also be made by spring contacts 507 situated at the side of the carrier and which function to snap engage the carrier in place within the base member 508. The carrier 501 has an indentation 509 in its side which in this example is an annular groove that encircles the carrier. Contacts 507 have curved upper ends which extend into the indentation 509 to clasp the carrier 501 in place after it is inserted into the base member 508. The contacts 501 are formed of resilient conductive material and are tensioned to bear against conductive inserts 511 which are embedded in the outer wall of the carrier 501 at indentation 509. Inserts 511 connect with the electronic components 512 which are within the carrier 501 and which may be of any of the previously described forms.

The resilient spring contacts 507 deflect momentarily as the carrier 501 is being entered into the base member 508 and then seat in indentation 509 to hold the carrier in place. The resiliency of the contacts 507 also enables withdrawal of the carrier 501 from base member 508 after the rotatable knob 513 has been disengaged from the base member.

For purposes of example FIGS. 54 and 55 depict a Hall effect type of control of the kind previously described with reference to FIGS. 40 to 43. Thus a magnet 193 is secured to the rotatable knob 513 of the circuit control 502 at a location adjacent to the carrier 501. Other electronic components 512 of the previously described Hall effect knob position sensing circuit, such as the Hall effect sensors, are within the replaceable carrier 501. This circuit has four of the spring contacts 507. As previously described, other types of knob position sensing circuit may have a different number of such contacts.

The spring contacts 501 extend between base member 508 and cover plate 504 and contact conductive pads 520 that are connected to the conductors 503 that extend along the plate to connect the control 502 with a controlled circuit in the previously described manner.

The knob 513 of this example is snap engaged on base member 508 by a resilient clasp 40 in the manner previously described with reference to FIGS. 5 and 6. A linear key protrusion 515 on the inner surface of the knob 513 is entered into a conforming groove in the outer wall of base member 508 to assure that the spring contacts 507 are positioned to contact inserts 511. Any of the other previously described forms of engagement of the knob on the base member may also be utilized.

Figures 56, 57:
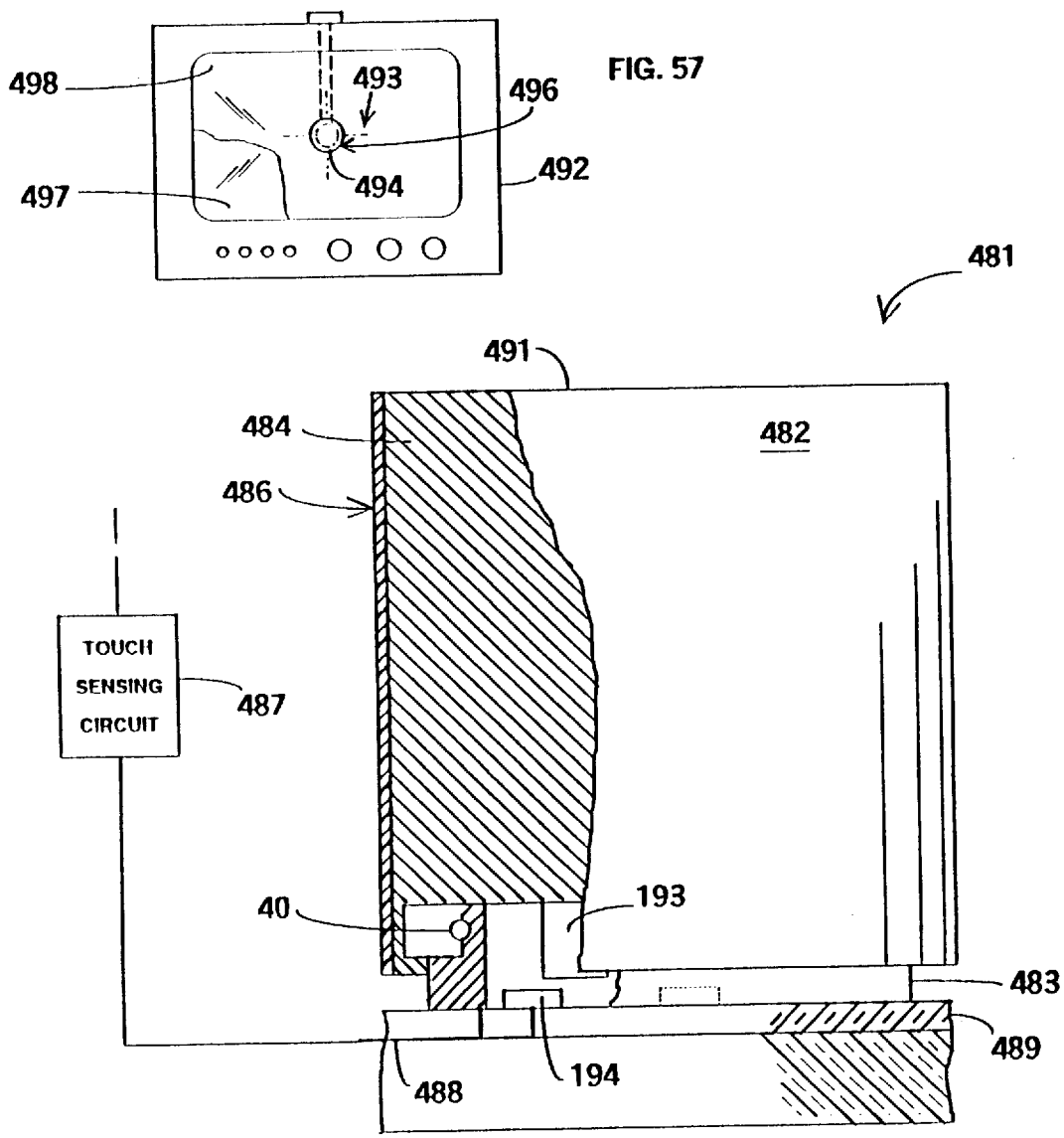
FIG. 56 is a section view of a touch sensitive circuit control embodying the invention.
FIG. 57 is a front view of another circuit control wherein changeable graphics are provided by a cathode ray tube type of display.

Referring to FIG. 56, any of the previously described embodiments of the invention may be adapted to function as a switch in addition to providing a circuit control signal of operator selected magnitude. For purposes of example, the control device 481 of FIG. 54 is of the form which uses a magnet 193 and analog Hall effect sensors 194 to track rotary motion of the knob 482 as previously described with reference to FIGS. 40 to 43 and in which the knob is held on the base member 483 by a resilient clasp 40 as previously described with reference to FIGS. 5 and 6.

To provide switching signals for turning a controlled circuit on and off or for other purposes, the knob 482 of this embodiment has a conductive metal core 484 with the cylindrical side wall of the core being covered by a layer of electrical insulation 486. The base member 483 of the control device 481 and the clasp 40 which holds the knob on the base member are also formed of conductive metal. A conductor 488 extends from the base member through the transparent cover plate 489 to which it is affixed and along the back of the cover plate to connect the conductive core 484 of the knob with the input of a touch sensing circuit 487. The touch sensing circuit 487 may be of any of the known forms which produce a switching signal, for such purposes as turning lamps on and off for example, in response to touching of a conductor by an operator.

The operator may selectively initiate a switching signal by touching the exposed surface 491 of the conductive knob core 484 at the front of the knob. Insulation 486 prevents unwanted production of switching signals when the operator grasps the sides of the knob 482 in order to turn the knob.

The image display devices of the previously described circuit controls are of the form known as flat panel displays wherein orthogonally extending arrays of x busbars and y busbars enable activation of different combinations of image pixels at different times to create changing images. Some newly developed display of this kind are flexible and can have a curved configuration. The term panel display as used herein and in the appended claims should be understood to refer to displays which have a curved shape as well to displays having a planar configuration.

Referring to FIG. 57, the image display device 492 which provides changeable graphics 493 in proximity to a turnable knob 494 of any of the previously described circuit control devices can be of the cathode ray tube type commonly used as computer monitors, in television receivers or for other purposes. The knob and base assembly 496 of any of the previously described types is affixed to the screen 497 of the cathode ray tube 492 or to a transparent overlay plate 498 which is superimposed on the screen.

Figure 58:
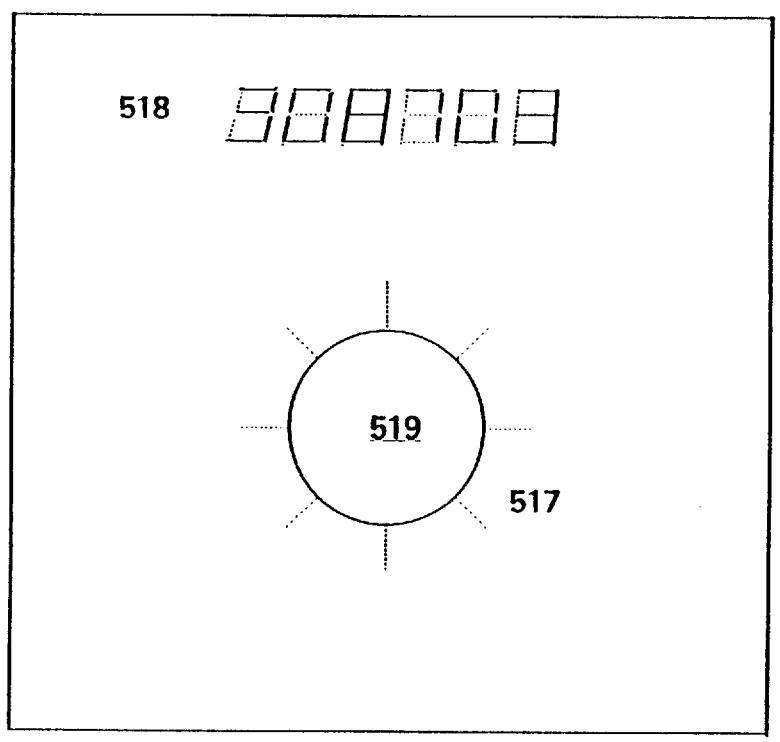
FIG. 58 is a frontal view of another circuit control wherein changeable graphics are provided by a flat panel display of the segmented electrode type.

The flat panel displays of the previously described embodiments are of the type in which grids of busbars are used to energize particular image pixels in an array of pixels as needed to form a desired image. Referring to FIG. 58, the flat panel displays 516 can be of the known segmented electrode type in which electrical energization of electrodes 517 within the display produces images corresponding to the configuration of the electrodes. Such electrodes can, for example, be configured and positioned to provide changeable calibration marks for a rotary knob 519. As is understood within the art such a display can be used to image any desired numeral from 0 to 9 by selective energizing of electrodes 518 which are electrically isolated from each other and which are arranged in the form of a slanting squared number 8.

While the invention has been described with reference to certain specific embodiments for purposes of example, many variations and modifications are possible and it is not intended to limit the invention except as defined in the following claims.

We claim:

1. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, and a control signal producing circuit which produces a signal indicative of the current angular orientation of said knob.

2. The control device of claim 1 wherein said image display device has a transparent cover plate at said image display area thereof, said base member being affixed to said transparent cover plate.

3. The control device of claim 1 wherein said control signal producing circuit has electronic components which are contained within at least one of said base member and said knob in front of said image display device.

4. The control device of claim 3 wherein said turnable knob is detachable from said base member and wherein at least a portion of said components of said control signal producing circuit are attached to a removable and replaceable carrier which is fitted into said base member between said turnable knob and said image display device.

5. The control device of claim 4 wherein said electronic display device has a transparent cover plate to which said base member is affixed, further including a plurality of electrical conductors extending along a surface of said cover plate for connecting said control device to a controlled circuit, said base member having a floor which faces said cover plate and which has a plurality of passages which extend towards said cover plate, said carrier having a plurality of conductive pins which extend into said passages to connect said electronic components with said electrical conductors.

6. The control device of claim 4 wherein said electronic display device has a transparent cover plate to which said base member is affixed, further including a plurality of electrical conductors extending along a surface of said cover plate for connecting said control device to a controlled circuit and at least a pair of resilient conductive contacts which are connected to separate ones of said electrical conductors, said resilient conductive contacts having first ends which are secured to said base member and second ends configured and positioned to clasp said carrier.

7. The control device of claim 1 wherein said image display device is a cathode ray tube form of display device.

8. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device wherein said turnable knob is detachable from said base member and wherein at least a portion of said components of said control signal producing circuit are embedded within said turnable knob and are detachable from said base member therewith.

9. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said image display device is a panel display of the form having x-busbars which extend in orthogonal relationship with y-busbars and which activate different combinations of image pixels at different times to provide changeable images.

10. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said image display device has a transparent cover plate at said image display area thereof, said base member being affixed to to said transparent cover plate, further including at least a pair of electrical conductors which extend along a surface of said transparent cover plate from said base member to an edge of said image display area for connecting said control device to said electrical circuit, and wiper contact means for electrically connecting said electrical conductors with components which are secured to said turnable knob, said wiper contact means being contained within said turnable knob and said base member in front of said image display device.

11. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, further including an image display device controller coupled to said image display device and which causes said image display device to present indicia at said image display area including indicia which are adjacent to said turnable knob at spaced apart locations around the perimeter thereof.

12. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said control device produces an initial sequence of control signal values at successive settings of said turnable knob, further including signal processing means for converting said initial sequence of control signal values to a differing sequence of assigned control signal values to compensate for deviations of said initial sequence of control signal values from a desired sequence of control signal values.

13. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said image display device has a transparent cover plate at said image display area thereof and wherein said base member is affixed to said transparent cover plate and wherein at least one opening extends into the transparent cover plate at the location of said circuit control device, said base member having a protrusion which extends into said opening.

14. The apparatus of claim 13 wherein a plurality of said control devices are attached to said transparent cover plate and wherein said transparent cover plate has a plurality of said openings including at least one opening at the location of each of said plurality of control devices, each of said control devices having at least one protrusion which extends into an opening at the location of the control device.

15. The apparatus of claim 13 wherein an electrical conductor extends along a surface of said transparent cover plate to connect said control device with a controlled circuit and wherein said protrusion is an electrical connector pin which connects an electronic component of said control device with said electrical conductor.

16. The apparatus of claim 13 wherein said transparent cover plate has a control signal conductor extending along a back surface of said cover plate and wherein said opening extends through said transparent cover plate, said protrusion being formed at least in part of electrically conductive material and being electrically connected to said control signal conductor and to a control signal producing circuit within said knob and base member.

17. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein at least a portion of said turnable knob is formed of electrically conductive material, further including a touch sensing circuit electrically connected to said electrically conductive material and which produces a circuit control signal in response to an operator touching said turnable knob.

18. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said turnable knob turns about an axis of rotation and wherein said base member forms a circular chamber situated between said turnable knob and a front surface of said image display device, further including a circular discontinuous electrical resistance situated in said chamber and which is centered on said axis of rotation, a first wiper contact carried by said turnable knob in position to contact said resistance and to travel therealong as said knob is turned, a second contact secured to said turnable knob and being electrically connected to said first wiper contact, and at least a first and a second conductor extending along said transparent cover plate, said first conductor being connected to said electrical resistance to apply voltage thereto and said second conductor being electrically connected to said second wiper to transmit a selectively variable voltage to an electrical circuit.

19. The apparatus of claim 18 wherein said base member is of annular configuration and wherein said electrical resistance is a trace of resistive material bonded to said front surface of said transparent cover plate.

20. The apparatus of claim 18 wherein said base member is cup shaped and has a base region which is adjacent to said front surface of said image display device, said electrical resistance being a trace of resistive material bonded to base region within said base member.

21. The apparatus of claim 18 wherein an electrically conductive surface extends around said axis of rotation within said chamber in spaced apart relationship with said electrical resistance and wherein said second contact is a wiper contact positioned to contact said conductive surface and to travel along said conductive surface as said knob turns, said second conductor being electrically connected to said conductive surface.

22. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said turnable knob has an internal chamber, further including an electrical resistance disposed in said chamber and extending in parallel relationship with an axis of rotation of said turnable knob, said resistance being secured to said transparent cover plate, a threaded rod extending along said axis of rotation within said internal chamber and being secured to said turnable knob, said threaded rod being formed of electrically conductive material, an internally threaded wiper sleeve disposed on said threaded rod and which engages the threads of said rod, said internally threaded sleeve having a projection which contacts said electrical resistance, a wiper guide secured to said transparent cover plate and extending into said internal chamber of said knob and being positioned to prevent rotation of said wiper sleeve when said knob is rotated whereby said wiper sleeve travels along said electrical resistance when said knob is turned, at least one first conductor secured to said transparent cover plate and being electrically connected to said electrical resistance to apply voltage thereto and a second conductor secured to said transparent cover plate for receiving an output voltage from said wiper sleeve.

23. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, further including an electrically conductive body carried by said turnable knob at a location which is offset from an axis of rotation thereof, a pair of spaced apart electrical coils disposed at fixed locations which are offset from said axis of rotation, each of said electrical coils being an inductive component of the resonant circuit of a separate one of a pair of electrical oscillators, and a digital data processor conditioned to detect changes in the ratio of the frequencies of said oscillators produced by movement of said conductive body and to generate an electrical circuit control signal that varies in response to changes of the ratio.

24. The control device of claim 23 wherein said image display device has a transparent cover plate at said image display area thereof, said base member being affixed to said transparent cover plate, and wherein said electrical coils are secured to the back surface of said said transparent cover plate.

25. The control device of claim 23 wherein said electrical coils are secured to a circuit board which is situated behind said image display device.

26. The control device of claim 23 wherein said electrical coils have an angular spacing from each other of about ninety degrees relative to said axis of rotation.

27. The control device of claim 23 wherein said electrical oscillators are disposed within said base member.

28. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, further including an electrically conductive body disposed within said base member at a location which is offset from an axis of rotation of said knob, a pair of spaced apart electrical coils carried by said knob at locations which are offset from said axis of rotation, each of said electrical coils being an inductive component of the resonant circuit of a separate one of a pair of electrical oscillators, and a digital data processor conditioned to detect changes in the ratio of the frequencies of said oscillators produced by movement of said conductive body and to generate an electrical circuit control signal that varies in response to changes of the ratio.

29. The control device of claim 28 wherein the region containing said conductive body and said electrical coils is substantially enclosed by electrically conductive shielding material.

30. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said image display device has a transparent cover plate at said image display area thereof, said base member being affixed to said transparent cover plate, further including at least one elongated first capacitor plate disposed between said transparent cover plate and said turnable knob and which curves around an axis of rotation thereof, said first capacitor plate having a width which progressively changes along at least a portion thereof, a second capacitor plate secured to said turnable knob in spaced apart relationship to said first capacitor plate in position to be traveled along said first capacitor plate as said knob is turned, said second capacitor plate being sized to extend along only a portion of the first capacitor plate, said first and second capacitor plates being part of the resonant circuit of an electrical oscillator, and a frequency detector coupled to said oscillator which outputs a circuit control signal which changes in response to changes of the frequency that is detected by the frequency detector.

31. The control device of claim 30 wherein said first capacitor plate is a trace of electrically conductive material bonded to said front surface of said transparent cover plate.

32. The control device of claim 30 wherein said first capacitor plate is a trace of electrically conductive material bonded to said base member.

33. The control device of claim 30 further including a curved band of electrical conductor extending alongside said first capacitor plate in spaced apart relationship therewith and being electrically connected to said oscillator, said second capacitor having a wiper contact positioned to travel along said band of electrical conductor as said knob is turned.

34. The control device of claim 30 further including a third capacitor plate extending in the plane of said first capacitor plate in spaced apart relationship therewith and which also curves around said axis of rotation of said turnable knob, said third capacitor plate having a width which progressively changes along at least a portion of thereof and wherein said third capacitor plate becomes progressively wider in the same direction that said first capacitor plate becomes progressively wider, said first and third capacitor plates being electrically connected to said oscillator to form the capacitive component of the resonant circuit thereof, and wherein said second capacitor plate faces both said first capacitor plate and said third capacitor plate in spaced apart relationship therewith.

35. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, further including a light source and a photoelectric light detector which are contained within said base member and turnable knob, said photoelectric light detector being positioned to detect light which travels from said light source to said photoelectric light detector along a light path, and means for altering a characteristic of the detected light in response to turning of said turnable knob to enable detection of the angular orientation of said turnable knob.

36. The apparatus of claim 35 wherein said light source directs light towards a surface of said turnable knob and wherein said means for altering a characteristic of the detected light includes a mirror disposed on said surface in position to reflect light from said light source to said photoelectric light detector, said mirror having a degree of reflectivity that progressively changes at successive locations along a circular path on the mirror that is centered on the axis of rotation of the turnable knob.

37. The apparatus of claim 35 wherein said light source directs light towards a surface of said turnable knob, further including a mirror disposed on said surface in position to reflect light from said light source to said photoelectric light detector, and wherein said means for altering a characteristic of the detected light includes a light modulating disk having a degree of light transmissivity that progressively changes at successive locations along a circular path on the disk that is centered on the axis of rotation of the turnable knob and which is intersected by said light path.

38. The apparatus of claim 35 having a pair of said photoelectric light detectors and wherein said light source directs light towards a surface of said turnable knob, further including a mirror disposed on said surface in position to reflect light from said light source to each of said photoelectric light detectors, and wherein said means for altering a characteristic of the detected light includes a light modulating disk having opaque areas that alternate with light transmissive areas along a circular path on the disk that is centered on the axis of rotation of the turnable knob and which is intersected by said light path, said opaque areas and light transmissive areas being configured to transmit light to both of said photoelectric light detectors at a first angular setting of said turnable knob and to transmit light only to a first of said photoelectric light detectors at the following angular setting of said turnable knob and to transmit light to neither of said photoelectric light detectors at the next angular setting of said turnable knob and to transmit light only to a second of said photoelectric light detectors at the following setting of said turnable knob as said knob is turned in one angular direction.

39. The apparatus of claim 35 further including an opaque light barrier extending between said light source and said photoelectric light detector.

40. The apparatus of claim 35 further including image display device controller means for causing said image display device to present an image of a dark area at the region of said image display area that is behind said light source and said photoelectric light detector.

41. The apparatus of claim 35 wherein said base member is affixed to a front surface of a transparent cover plate of said image display device and wherein said light source and said photoelectric light detector are situated at a back surface of said transparent cover plate.

42. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said image display device has a transparent cover plate at said image display area thereof, said base member being affixed to said transparent cover plate, further including a magnet secured to said turnable knob at a location which is offset from an axis of rotation thereof, at least a first Hall effect sensor and a second Hall effect sensor disposed between said turnable knob and said transparent cover plate which Hall effect sensors are spaced apart from each other, and a signal processor electrically coupled to said Hall effect sensors and being conditioned to produce a circuit control signal that varies in response to variations of the resistances of said Hall effect sensors caused by rotary motion of said turnable knob and magnet.

43. The control device of claim 42 further including a third Hall effect sensor disposed between said turnable knob and said transparent cover plate and being electrically coupled to said signal processor, said third Hall effect sensor being offset from said axis of rotation of said turnable knob and being spaced apart from said first and second Hall effect sensors.

44. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, further including a magnet secured to said turnable knob at a location which is offset from an axis of rotation thereof and a magnetic pad which generates an output signal in response to rotary movement of the magnet, said magnetic pad being behind said image display device.

45. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said turnable knob has an opening into which said base member extends, said base member having a circumferential groove situated within said opening and said turnable knob having a slot in a side wall thereof which bounds said opening, further including an elongate loop of resilient spring material disposed in said opening, said loop having a first end which is secured to said side wall of said turnable knob and a second end which extends into said slot, said loop being proportioned to snap engage in said groove as said turnable knob is forced into said base member.

46. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein one of said base member and said turnable knob has an opening into which a peripheral portion of the other of said base member and said knob is fitted, a portion of said opening being narrower than said peripheral portion whereby said turnable knob snap engages on said base member.

47. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said turnable knob has a base with a circular opening therein that is centered on an axis of rotation of said turnable knob and wherein said base member has an annular peripheral portion which is seated in said opening and which has a diameter conforming to the diameter of said opening, further including a post extending along said axis of rotation within said turnable knob and having a flanged end which extends towards said transparent cover plate, and a socket engaging said flanged end of said post and being secured to said transparent cover plate.

48. A control device for an electrical circuit which control device has a base member and a turnable knob coupled thereto, the knob being turnable to any of a plurality of different angular orientations to change an electrical condition in the circuit, wherein the improvement comprises:

said base member being affixed to an electronic image display device which has an image display area at which instantly changeable images are displayed, said base member and knob being in front of said image display device and wherein at least a portion of said knob overlays the image display area of said image display device, wherein said image display device is a panel display having segmented electrodes which are energized to produce changeable images.

* * * * *